United States Patent
Li et al.

(10) Patent No.: US 12,183,802 B2
(45) Date of Patent: Dec. 31, 2024

(54) METHOD OF MANUFACTURING SEMICONDUCTOR DEVICES AND SEMICONDUCTOR DEVICES

(71) Applicant: TAIWAN SEMICONDUCTOR MANUFACTURING COMPANY, LTD., Hsinchu (TW)

(72) Inventors: Yi-Jing Li, Hsinchu (TW); Chih-Hsin Ko, Fongshan (TW); Clement Hsingjen Wann, Carmel, NY (US)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 86 days.

(21) Appl. No.: 17/510,105

(22) Filed: Oct. 25, 2021

(65) Prior Publication Data

US 2022/0045190 A1 Feb. 10, 2022

Related U.S. Application Data

(62) Division of application No. 16/693,988, filed on Nov. 25, 2019, now Pat. No. 11,158,719.

(Continued)

(51) Int. Cl.
*H01L 29/49* (2006.01)
*H01L 21/8238* (2006.01)
(Continued)

(52) U.S. Cl.
CPC .. *H01L 29/4966* (2013.01); *H01L 21/823821* (2013.01); *H01L 21/823828* (2013.01);
(Continued)

(58) Field of Classification Search
CPC ............... H01L 29/4966; H01L 29/401; H01L 29/66795; H01L 29/785; H01L 21/823821; H01L 21/823828; H01L 27/0924
See application file for complete search history.

(56) References Cited

U.S. PATENT DOCUMENTS 9,653,604 B1 5/2017 Colinge et al.
10,037,995 B2 7/2018 Liao et al.
(Continued)

FOREIGN PATENT DOCUMENTS

CN 107068755 A 8/2017
CN 108122909 A 6/2018
(Continued)

OTHER PUBLICATIONS

Non-Final Office Action issued in U.S. Appl. No. 16/693,988, dated Feb. 16, 2021.
(Continued)

*Primary Examiner* — Shaun M Campbell
(74) *Attorney, Agent, or Firm* — STUDEBAKER & BRACKETT PC

(57) ABSTRACT

In a method of manufacturing a semiconductor device, a gate dielectric layer is formed over a channel region made of a semiconductor material, a first barrier layer is formed on the gate dielectric layer, a second barrier layer is formed on the first barrier layer, a first work function adjustment layer is formed on the second barrier layer, the first work function adjustment layer and the second barrier layer are removed. After the first work function adjustment layer and the second barrier layer are removed, a second work function adjustment layer is formed over the gate dielectric layer, and a metal gate electrode layer is formed over the second work function adjustment layer.

20 Claims, 20 Drawing Sheets

Related U.S. Application Data

(60) Provisional application No. 62/774,133, filed on Nov. 30, 2018.

(51) Int. Cl.
*H01L 27/092* (2006.01)
*H01L 29/40* (2006.01)
*H01L 29/66* (2006.01)
*H01L 29/78* (2006.01)

(52) U.S. Cl.
CPC ........ *H01L 27/0924* (2013.01); *H01L 29/401* (2013.01); *H01L 29/66795* (2013.01); *H01L 29/785* (2013.01)

(56) References Cited

U.S. PATENT DOCUMENTS

| | | | | |
|---|---|---|---|---|
| 10,049,940 | B1* | 8/2018 | Chen | H01L 23/53266 |
| 11,043,489 | B2 | 6/2021 | Chang et al. | |
| 2013/0075827 | A1* | 3/2013 | Lee | H01L 29/66545 |
| | | | | 438/301 |
| 2015/0145057 | A1* | 5/2015 | Fan | H01L 29/4966 |
| | | | | 257/369 |
| 2015/0357244 | A1* | 12/2015 | Ragnarsson | H01L 21/28088 |
| | | | | 438/275 |
| 2015/0357426 | A1 | 12/2015 | Kim et al. | |
| 2017/0032972 | A1 | 2/2017 | Tsai et al. | |
| 2017/0076995 | A1 | 3/2017 | Chang et al. | |
| 2017/0221717 | A1 | 8/2017 | Colinge et al. | |
| 2017/0229461 | A1* | 8/2017 | Liao | H01L 27/092 |
| 2017/0301551 | A1* | 10/2017 | Kang | H01L 27/088 |
| 2018/0174922 | A1* | 6/2018 | Chiu | H01L 29/66545 |
| 2018/0301371 | A1 | 10/2018 | Wang et al. | |
| 2019/0348517 | A1 | 11/2019 | Wang et al. | |

FOREIGN PATENT DOCUMENTS

| | | |
|---|---|---|
| KR | 2003-0000572 A | 1/2003 |
| KR | 10-2010-0108190 A | 10/2010 |
| KR | 10-2013-0033270 A | 4/2013 |
| KR | 10-2015-0141433 A | 12/2015 |
| KR | 10-2017-0015055 A | 2/2017 |
| KR | 10-2018-0117018 A | 10/2018 |
| TW | 201735190 A | 10/2017 |
| WO | 2009/002670 A1 | 12/2008 |

OTHER PUBLICATIONS

Notice of Allowance issued in U.S. Appl. No. 16/693,988, dated Jun. 14, 2021.

* cited by examiner

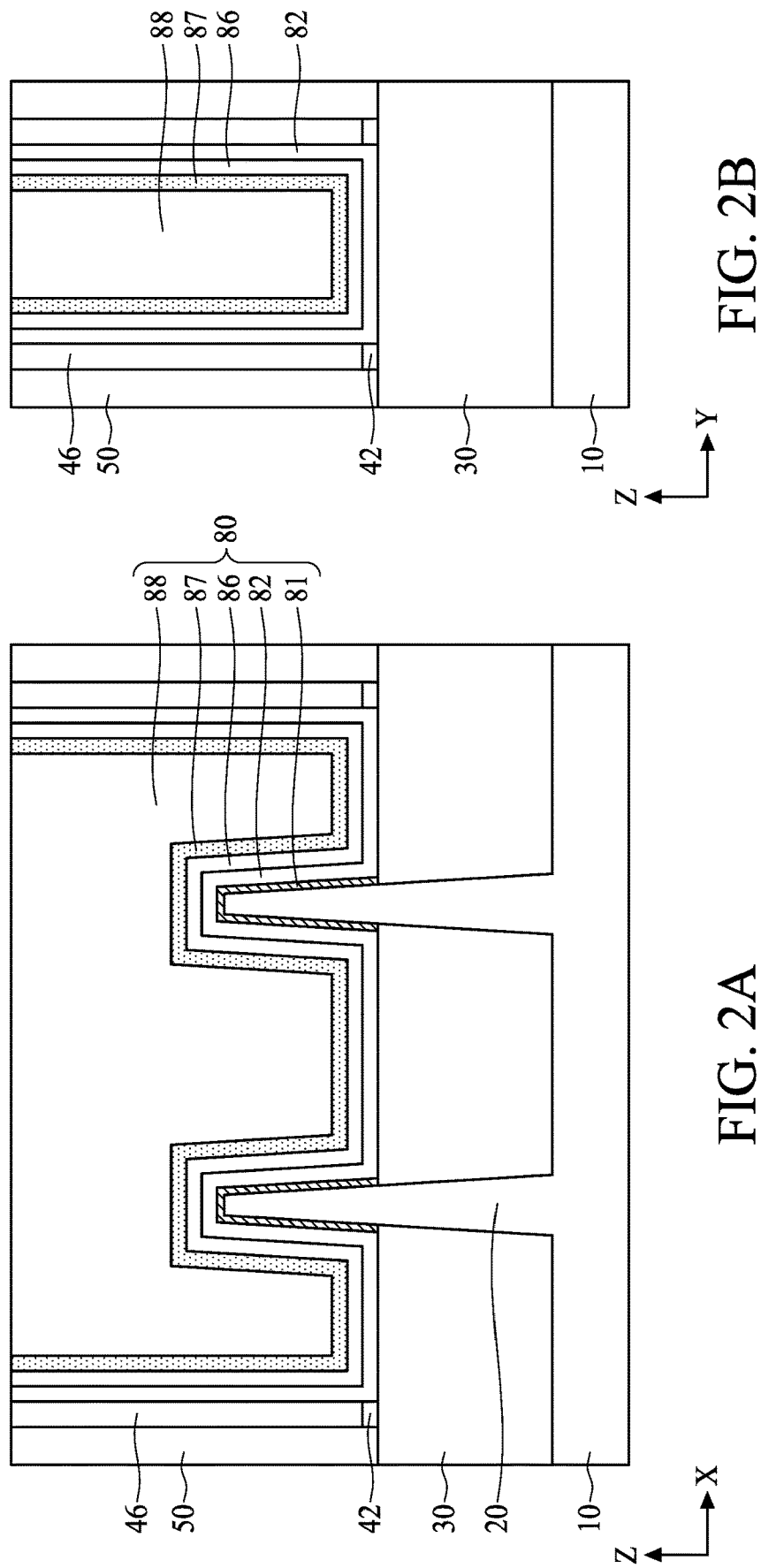

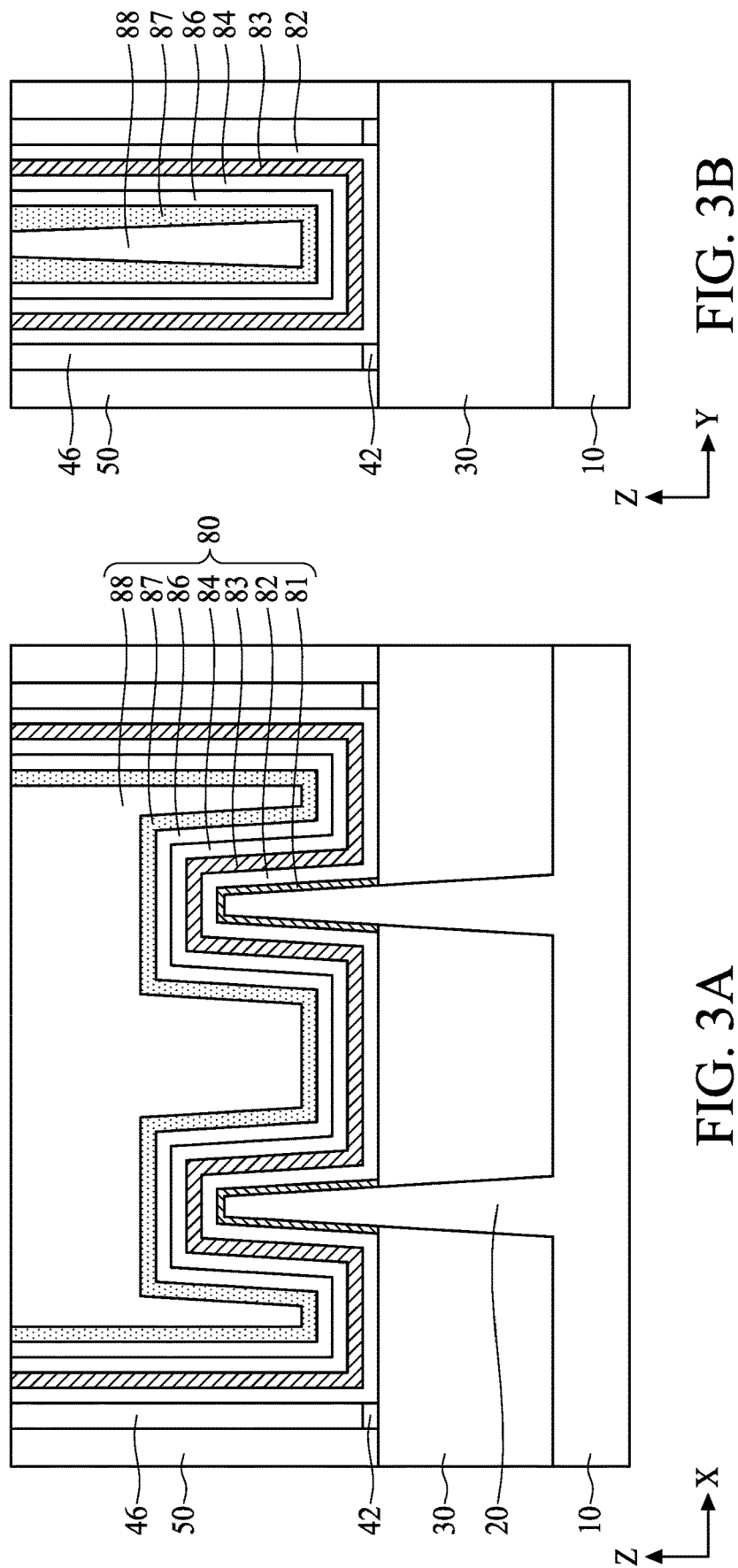

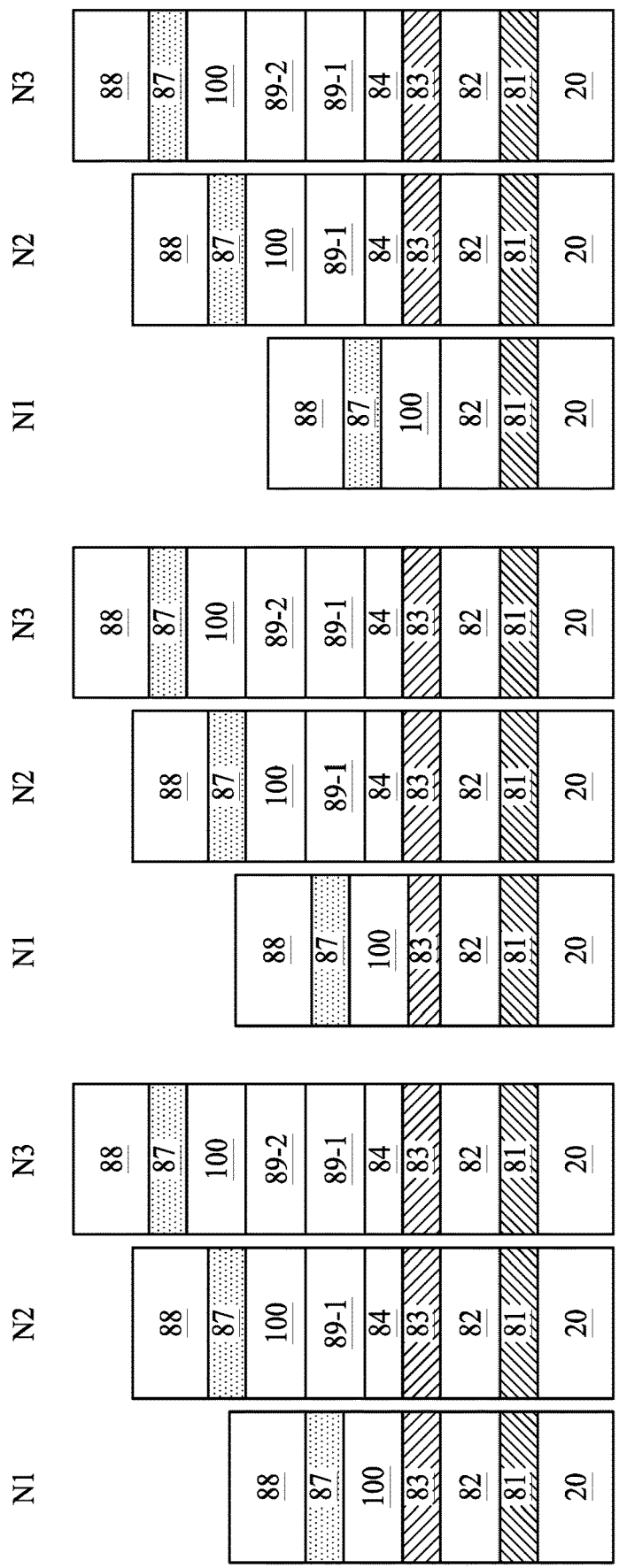

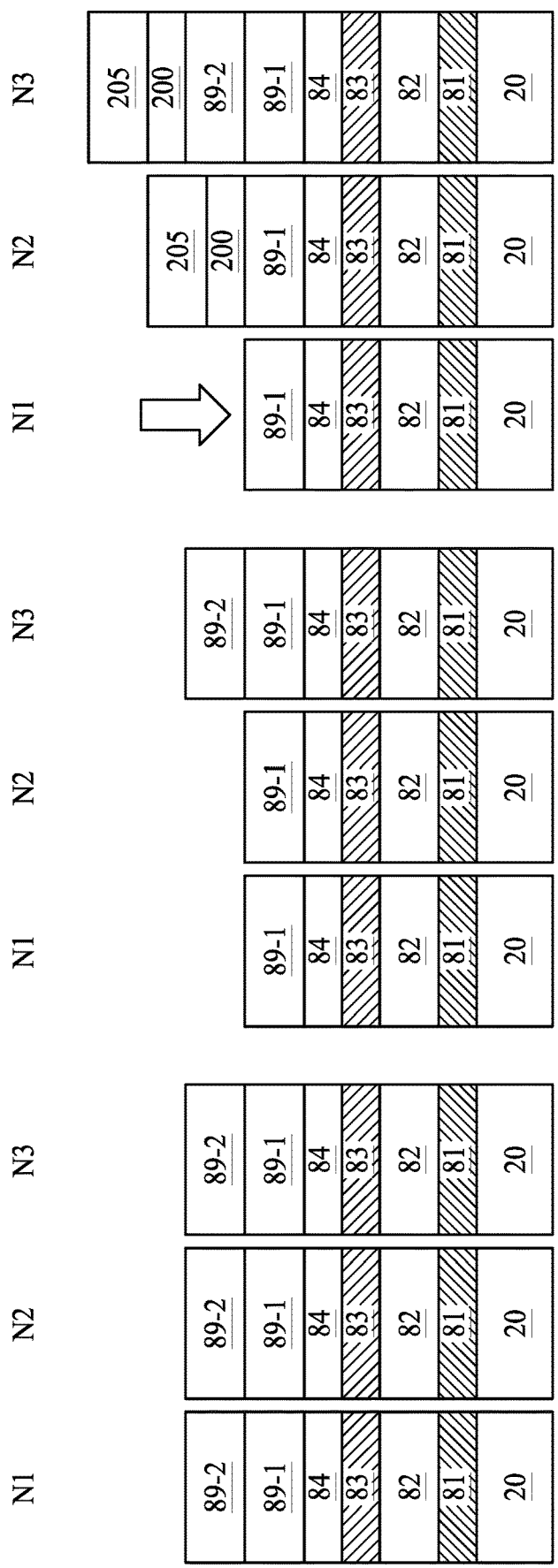

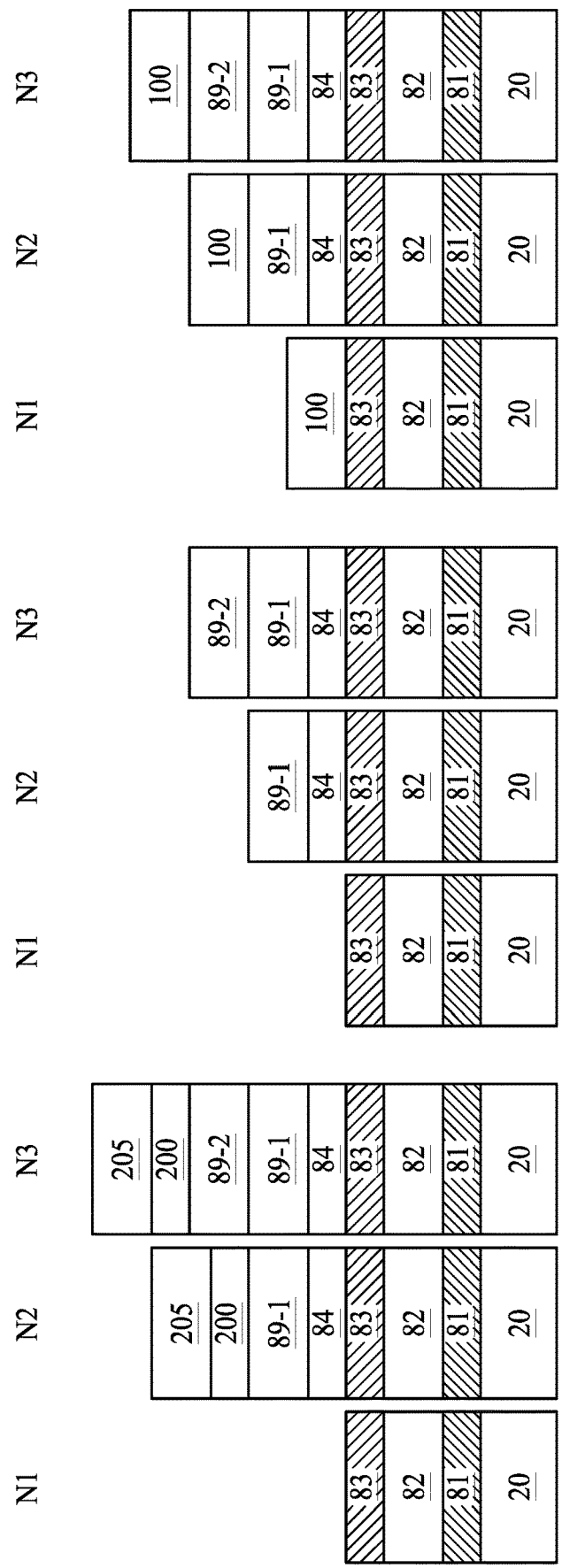

METHOD OF MANUFACTURING SEMICONDUCTOR DEVICES AND SEMICONDUCTOR DEVICES

RELATED APPLICATIONS

This application is a divisional of U.S. patent application Ser. No. 16/693,988 filed Nov. 25, 2019, now U.S. Pat. No. 11,158,719, which claims priority to U.S. Provisional Application No. 62/774,133 filed Nov. 30, 2018, the entire content of each of which is incorporated herein by reference.

BACKGROUND

With increasing down-scaling of integrated circuits and increasingly demanding requirements of speed of integrated circuits, transistors need to have higher drive currents with increasingly smaller dimensions. Fin Field-Effect Transistors (FinFET) were thus developed. FinFETs include vertical semiconductor fins above a substrate. The semiconductor fins are used to form source and drain regions, and channel regions between the source and drain regions. Shallow Trench Isolation (STI) regions are formed to define the semiconductor fins. The FinFETs also include gate stacks, which are formed on the sidewalls and the top surfaces of the semiconductor fins. The gate stack includes multiple layers of dielectric materials and conductive materials.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A and 2B show cross section views.

FIGS. 3A and 3B show cross section views.

FIGS. 6A, 6B and 6C show various configurations of a gate stack according to embodiments of the present disclosure.

FIGS. 7A, 7B, 7C, 7D, 7E and 7F show cross sectional views of various stages of a sequential manufacturing process of a semiconductor device according to embodiments of the present disclosure.

DETAILED DESCRIPTION

Figures 1A, 1B:
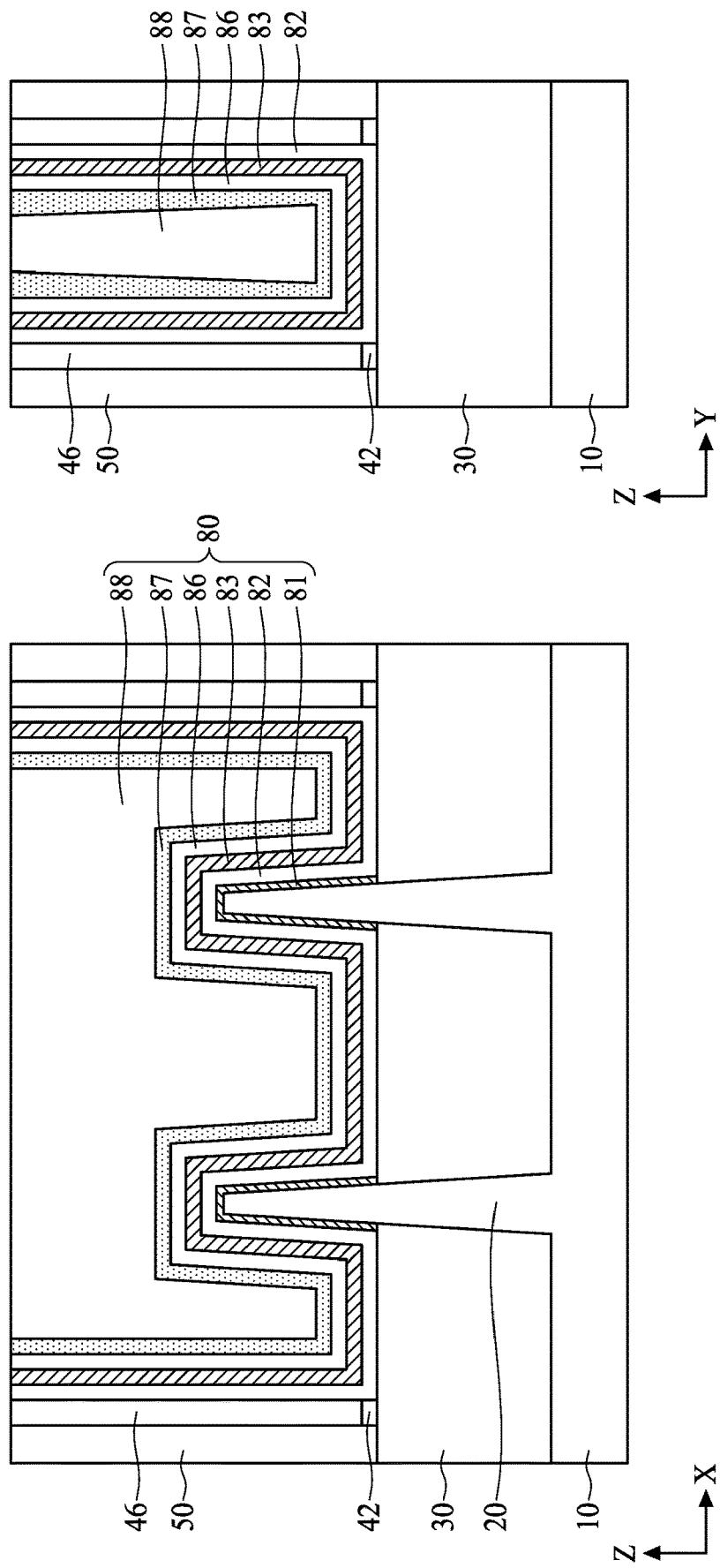
FIGS. 1A and 1B show cross section views.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations in between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain. In the following embodiments, materials, configurations, dimensions, processes and/or operations as described with respect to one embodiment (e.g., one or more figures) may be employed in the other embodiments, and detailed description thereof may be omitted.

Disclosed embodiments relate to a semiconductor device, in particular, a gate structure of a field effect transistor (FET) and its manufacturing method. The embodiments such as those disclosed herein are generally applicable not only to planar FETs but also to a fin FET (FinFET), a double-gate FET, a surround-gate FET, an omega-gate FET or a gate-all-around (GAA) FET, and/or nanowire transistors, or any suitable device having one or more work function adjustment material (WFM) layers in the gate structure.

In FET structures, building multiple threshold voltage (Vt) devices with low Vt is very crucial for low power consumption and boosting device performance. Composition and thickness of metal gate films play a crucial role in defining the device work function, Vt. Multiple FETs having different threshold voltages can be realized by adjusting materials and/or thicknesses of one or more work function adjustment material layers (WFMs) disposed between a gate dielectric layer and a body metal gate electrode layer (e.g., a W layer). A metal gate structure is generally formed by using a gate replacement technology, in which a gate stack is formed in a narrow, high aspect ratio trench (gate space), from which a sacrificial gate structure is removed.

As devices shrink, forming a gate stack of field effect transistors becomes more challenging. Difficulties include metal filling capability in narrow, high aspect ratio tranches, loss of space in the gate space due to barrier layers in the gate space. In particular, when one or more barrier and/or cap layers are formed on a gate dielectric layer in such a narrow trench of a gate space, the total thickness of the barrier layer at a corner of the trench tends to be thicker than at a bottom flat portion of the trench. In such a case, a work function adjustment layer formed on the barrier layers would not sufficiently adjust the work function at the corners of the trench. This results in a higher threshold voltage at the corners of the metal gate structure.

To reduce or adjust the threshold voltage, a portion of the work function adjustment layers and/or barrier layers could be removed before the work function adjustment layer is formed. Thinning or removing of work function adjustment layers and/or barrier layers may be done by dry etching operations. However, the dry etching operation may also damage the underlying layers. In addition, different device threshold voltages for different types of devices limits the ability to produce different devices using the same process operations. Further, the metal gate structure is differently configured for NFET and PFET structures, and removing and/or thinning operations for one type of FET would cause damage to other types of FETs.

The present disclosure provides a novel process for removing and/or thinning of a work function adjustment layer and/or a barrier layer to suppress damage to the underlying layer and to other FETs.

Figure 1C:
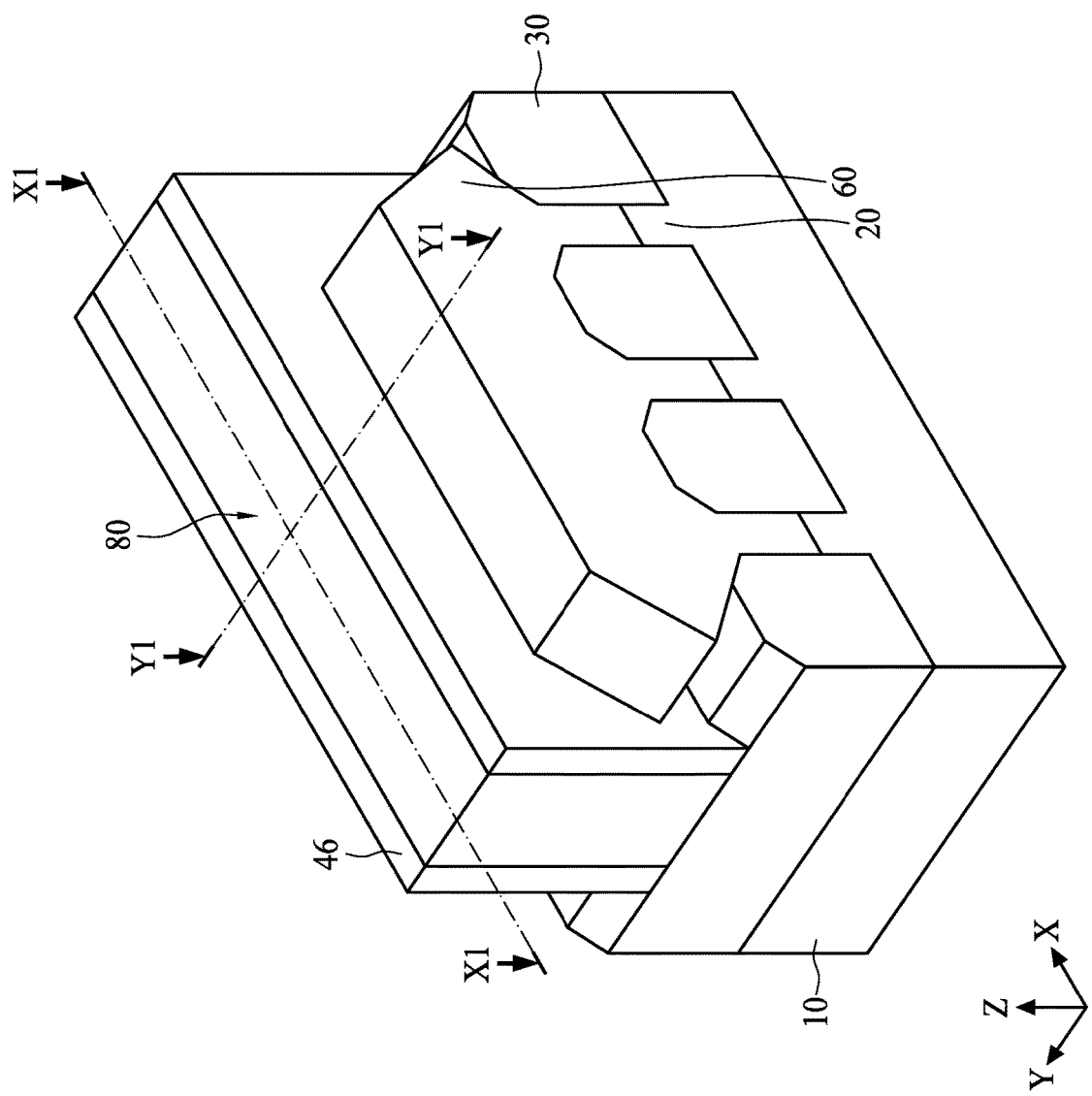
FIG. 1C shows a perspective view of a semiconductor device according to an embodiment of the present disclosure.
Figure 2C:
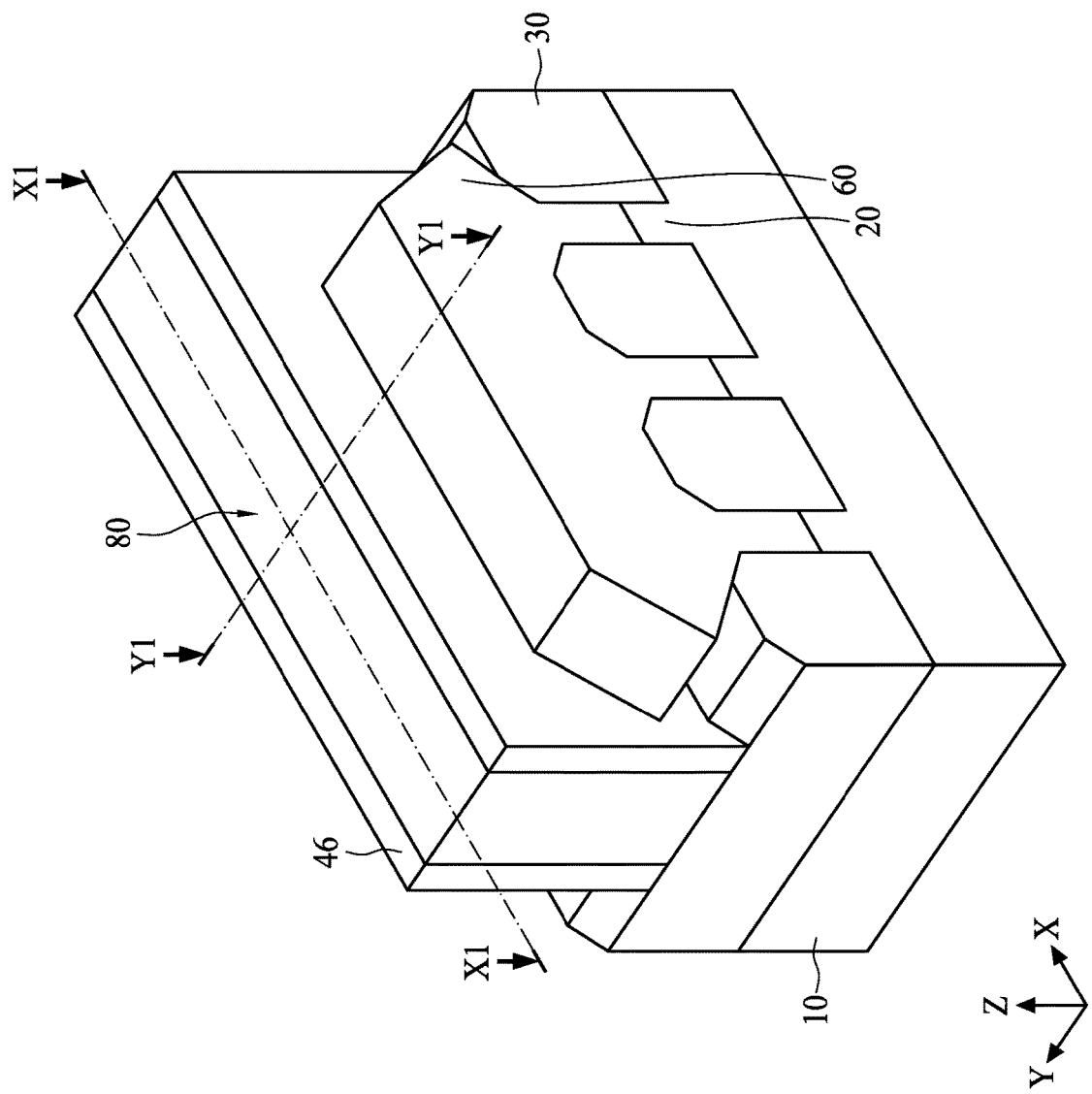
FIG. 2C shows a perspective view of a semiconductor device according to an embodiment of the present disclosure.
Figure 3C:
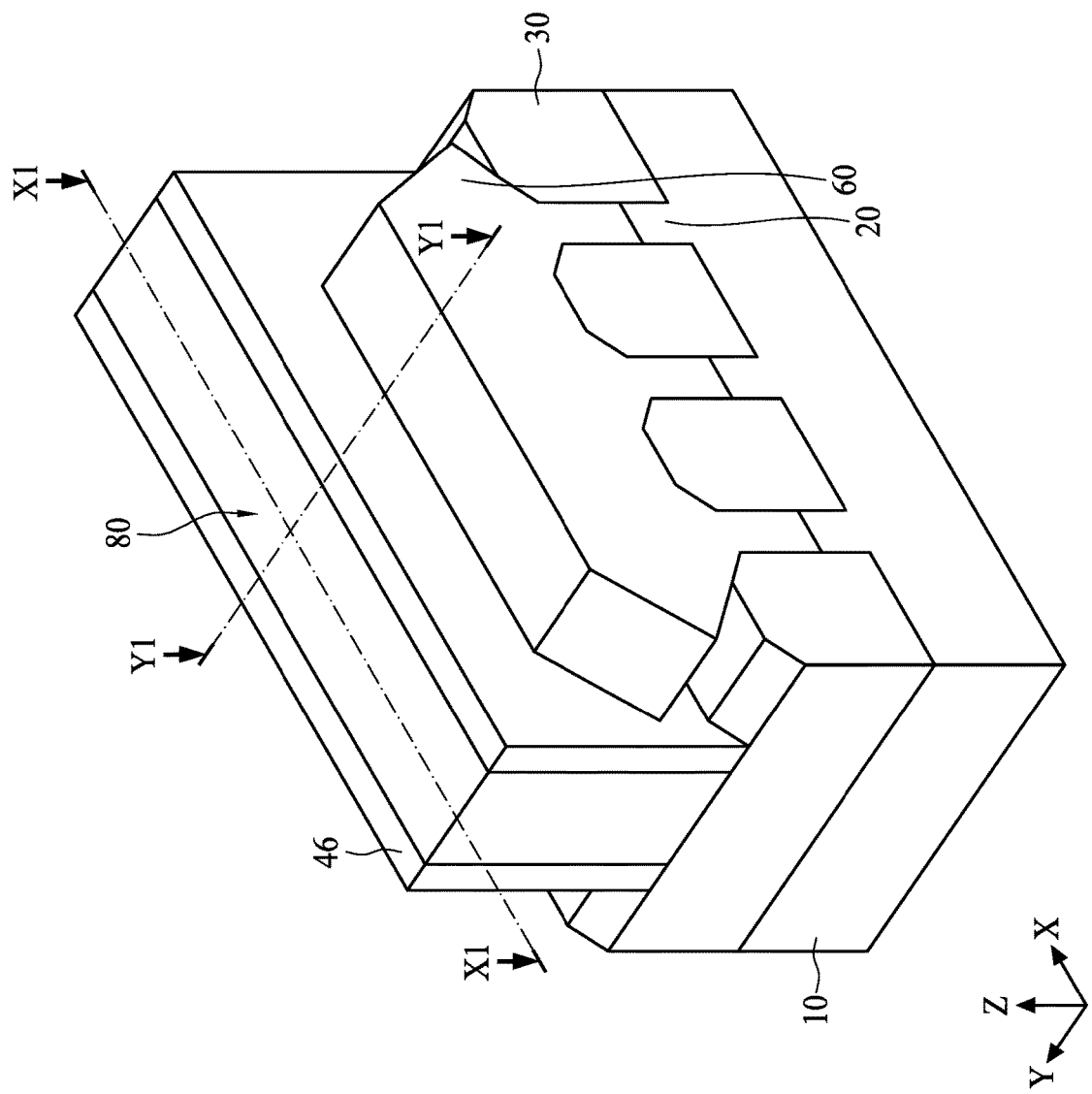
FIG. 3C shows a perspective view of a semiconductor device according to an embodiment of the present disclosure.

FIGS. 1A and 1B show cross section views, and FIG. 1C shows a perspective view of a semiconductor device according to an embodiment of the present disclosure. FIG. 1A shows a cross section view along line X1-X1 of FIG. 1C and FIG. 1B shows a cross sectional view along line Y1-Y1 of FIG. 1C. In FIGS. 1A-3C, although FIGS. 1C, 2C and 3C show three fin structures, FIGS. 1A, 2A and 3A show only two fin structures for simplicity.

In some embodiments, a semiconductor device includes a gate stack 80 disposed over a channel region of a fin structure 20. The gate stack 80 includes an interfacial layer 81, a gate dielectric layer 82, a first conductive layer 83 as a first barrier (or a cap) layer, one or more work function adjustment material layers or work function adjustment material layers (a WFM layer) 86, a glue layer 87 and a body gate electrode layer 88, as shown in FIG. 1A. In some embodiments, the fin structure 20 is provided over a substrate 10 and protrudes from an isolation insulating layer 30. Further, gate sidewall spacers 46 are disposed on opposite side faces of the gate stack 80 and one or more dielectric layers 50 are formed to cover the gate sidewall spacers 46. In some embodiments, a piece of insulating material 42 is disposed between the gate sidewall spacer 46 and the isolation insulating layer 30. Further, as shown in FIG. 1C, source/drain epitaxial layers 60 are formed over recessed fin structures. Although FIG. 1A shows two fin structures and FIG. 1C shows three fin structures, the number of fin structures is not limited to those shown in FIGS. 1A and 1C.

In some embodiments, the first conductive layer 83 includes a metal nitride, such as WN, TaN, TiN and TiN doped with Si (TiNSi). In some embodiments, TiN is used. The thickness of the first conductive layer 83 is in a range from about 0.5 nm to about 10 nm in some embodiments, and is in a range from about 1 nm to about 5 nm in other embodiments, depending on the device/process/design requirement.

In some embodiments, the WFM layer 86 is made of a conductive material such as a single layer of TiN, WN, TaAlC, TiC, TaAl, TaC, Co, Al, TiAl, or TiAlC, or a multilayer of two or more of these materials. For the n-type FET, an aluminum containing layer, such as TiAl, TiAlC, TaAl and/or TaAlC is used as an n-type WFM layer, and for the p-type FET, one or more of TaN, TiN, WN, TiC, WCN, MoN and/or Co is used as a p-type WFM layer. In some embodiments, an n-type WFM layer is composed of materials having low work function in a range from about 2.5 eV to about 4.4 eV and/or having a low electronegativity. In some embodiments, a p-type WFM layer is composed of materials having a high work function in a range from about 4.3 eV to 5.8 eV and/or having high electronegativity.

In some embodiments, the glue layer 87 is made of TiN. In some embodiments, the body gate electrode layer 88 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

FIGS. 2A and 2B show cross section views, and FIG. 2C shows a perspective view of a semiconductor device according to another embodiment of the present disclosure. FIG. 2A shows a cross section view along line X1-X1 of FIG. 2C and FIG. 2B shows a cross sectional view along line Y1-Y1 of FIG. 2C.

In this embodiments, no first conductive layer is disposed between the WFM layer 86 and the gate dielectric layer 82. Accordingly, a gate space before the WFM layer 86 is formed has a broader space than the embodiment of FIGS. 1A-1C.

FIGS. 3A and 3B show cross section views, and FIG. 3C shows a perspective view of a semiconductor device according to another embodiment of the present disclosure. FIG. 3A shows a cross section view along line X1-X1 of FIG. 3C and FIG. 3B shows a cross sectional view along line Y1-Y1 of FIG. 3C.

In this embodiment, a second conductive layer 84 as a second barrier layer is formed between the first conductive layer 83 and the WFM layer 86.

In some embodiments, the second conductive layer 84 includes a metal nitride, such as WN, TaN, TiN and TiNSi. In some embodiments, TaN is used. The thickness of the second conductive layer 84 is in a range from about 0.5 nm to about 10 nm in some embodiments, and is in a range from about 1 nm to about 5 nm in other embodiments depending on the device/process/design requirement. In some embodiments, the second conductive layer 84 functions as a barrier layer or an etch stop layer. In some embodiments, the second conductive layer 84 is thinner than the first conductive layer 83.

FIGS. 4A-5F show cross sectional views of various stages of a sequential manufacturing process of the semiconductor device according to an embodiment of the present disclosure. FIG. 5G shows a process flow of manufacturing a semiconductor device according to an embodiment of the present disclosure. It is understood that in the sequential manufacturing process, one or more additional operations can be provided before, during, and after the stages shown in FIGS. 4A-5F, and some of the operations described below can be replaced or eliminated for additional embodiments of the method. The order of the operations/processes may be interchangeable. Materials, configurations, dimensions, processes and/or operations as described with respect to embodiments of FIGS. 1A-3C can be employed in the following embodiments, and detailed description thereof may be omitted.

Figure 4B:
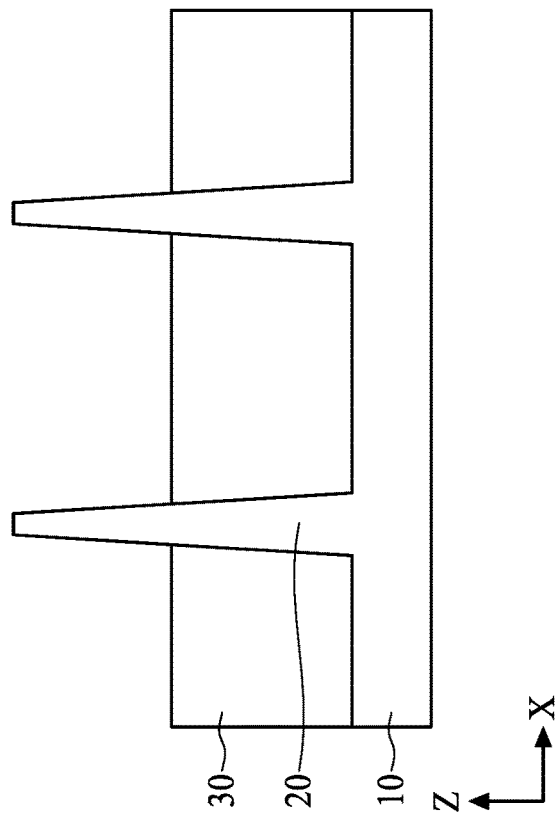
FIGS. 4A, 4B, 4C and 4D show cross sectional views of various stages of a sequential manufacturing process of a semiconductor device according to an embodiment of the present disclosure.
Figure 4A:
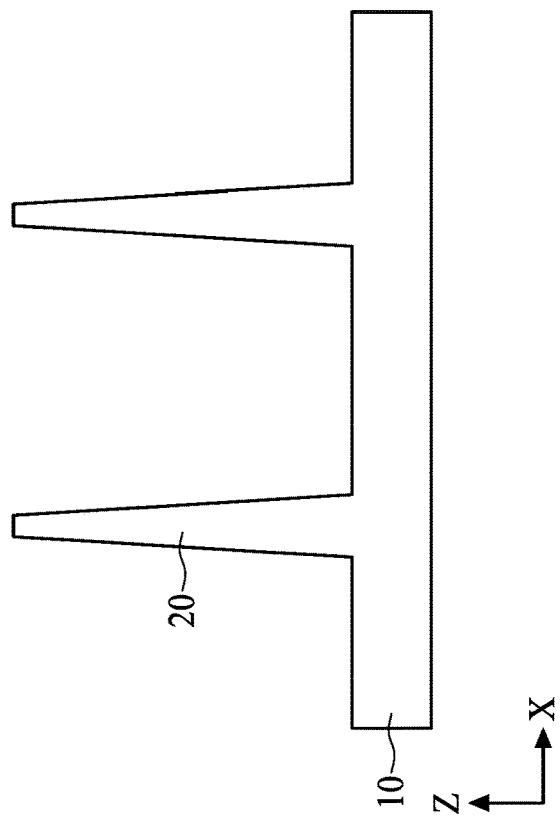

As shown in FIG. 4A, one or more fin structures 20 are fabricated over a substrate 10. The substrate 10 is, for example, a p-type silicon substrate with an impurity concentration in a range of about $1\times10^{15}$ cm$^{-3}$ to about $1\times10^{18}$ cm$^{-3}$. In other embodiments, the substrate 10 is an n-type silicon substrate with an impurity concentration in a range of about $1\times10^{15}$ cm$^{-3}$ to about $1\times10^{18}$ cm$^{-3}$. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The fin structures 20 can be patterned by any suitable method. For example, the fin structures 20 can be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 20.

As shown in FIG. 4A, two fin structures 20 extending in the Y direction are disposed adjacent to each other in the X direction. However, the number of the fin structures is not limited to two. The numbers may be one, three, four or five or more. In addition, one of more dummy fin structures may be disposed adjacent to both sides of the fin structures 20 to improve pattern fidelity in patterning processes. The width of the fin structure 20 is in a range of about 5 nm to about 40 nm in some embodiments, and is in a range of about 7 nm to about 15 nm in certain embodiments. The height of the fin structure 20 is in a range of about 100 nm to about 300 nm in some embodiments, and is in a range of about 50 nm to 100 nm in other embodiments. The space between the fin structures 20 is in a range of about 5 nm to about 80 nm in some embodiments, and is in a range of about 7 nm to 15 nm in other embodiments. One skilled in the art will realize, however, that the dimensions and values recited throughout the descriptions are merely examples, and may be changed to suit different scales of integrated circuits. In some embodiments, the Fin FET device is an n-type Fin FET. In other embodiments, the Fin FET device is a p-type Fin FET.

After the fin structures 20 are formed, an isolation insulating layer 30 is formed over the fin structures 20, as shown in FIG. 4B.

The isolation insulating layer 30 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), a mixture of MSQ and HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. The flowable film may be doped with boron and/or phosphorous. The isolation insulating layer 30 may be formed by one or more layers of spin-on-glass (SOG), SiO, SiON, SiOCN and/or fluoride-doped silicate glass (FSG) in some embodiments.

After forming the isolation insulating layer 30 over the fin structures 20, a planarization operation is performed so as to remove part of the isolation insulating layer 30 and the mask layer (the pad oxide layer and the silicon nitride mask layer). The planarization operation may include a chemical mechanical polishing (CMP) and/or an etch-back process. Then, the isolation insulating layer 30 is further removed so that an upper part of the fin structure 20, which is to become a channel layer, is exposed, as shown in FIG. 4B.

In certain embodiments, the partial removing of the isolation insulating layer 30 is performed using a wet etching process, for example, by dipping the substrate in hydrofluoric acid (HF). In another embodiment, the partial removing of the isolation insulating layer 30 is performed using a dry etching process. For example, a dry etching process using $CHF_3$ or $BF_3$ as etching gases may be used.

After forming the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

Figure 4C:
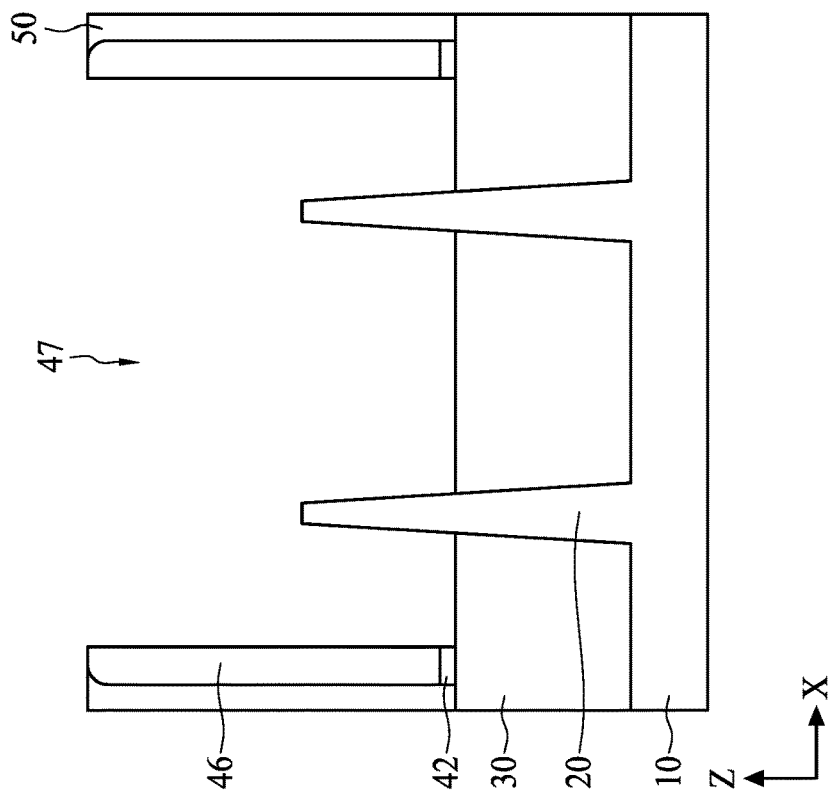

Then, a dummy gate structure 40 is formed over part of the fin structures 20 as shown in FIG. 4C.

A dielectric layer and a poly silicon layer are formed over the isolation insulating layer 30 and the exposed fin structures 20, and then patterning operations are performed so as to obtain a dummy gate structure including a dummy gate electrode layer 44 made of poly silicon and a dummy gate dielectric layer 42. The patterning of the poly silicon layer is performed by using a hard mask including a silicon nitride layer and an oxide layer in some embodiments. The dummy gate dielectric layer 42 can be silicon oxide formed by CVD, PVD, ALD, e-beam evaporation, or other suitable process. In some embodiments, the dummy gate dielectric layer 42 includes one or more layers of silicon oxide, silicon nitride, silicon oxy-nitride, or high-k dielectrics. In some embodiments, a thickness of the dummy gate dielectric layer is in a range of about 1 nm to about 5 nm.

In some embodiments, the dummy gate electrode layer 44 is doped poly-silicon with uniform or non-uniform doping. In the present embodiment, the width of the dummy gate electrode layer 44 is in the range of about 30 nm to about 60 nm. In some embodiments, a thickness of the dummy gate electrode layer is in a range of about 30 nm to about 50 nm. In addition, one of more dummy gate structures may be disposed adjacent to both sides of the dummy gate structure 40 to improve pattern fidelity in patterning processes. The width of the dummy gate structure 40 is in a range of about 5 nm to about 40 nm in some embodiments, and is in a range of about 7 nm to about 15 nm in certain embodiments.

Further, as shown in FIG. 4C, sidewall spacers 46 are formed on opposite side faces of the dummy gate structures 40. An insulating material layer for sidewall spacers 46 is formed over the dummy gate structure 40. The insulating material layer is deposited in a conformal manner so that it is formed to have substantially equal thicknesses on vertical surfaces, such as the sidewalls, horizontal surfaces, and the top of the dummy gate structure 40, respectively. In some embodiments, the insulating material layer has a thickness in a range from about 5 nm to about 20 nm. The insulating material layer includes one or more of SiN, SiON and SiCN or any other suitable dielectric material. The insulating material layer can be formed by ALD or CVD, or any other suitable method. Next, bottom portions of the insulating material layer are removed by anisotropic etching, thereby forming sidewall spacers 46. In some embodiments, the sidewall spacers 46 include two to four layers of different insulating materials. In some embodiments, part of the dummy gate dielectric layer 42 is disposed between the sidewall spacers 46 and the isolation insulating layer 30. In other embodiments, no part of the dummy gate dielectric layer 42 is disposed between the sidewall spacers 46 and the isolation insulating layer 30.

Subsequently, a source/drain region of the fin structure 20 not covered by the dummy gate structure 40 is etched down (recessed) to form a source/drain recess in some embodiments. After the source/drain recess is formed, one or more source/drain epitaxial layers 60 (see, FIGS. 1C, 2C and 3C) are formed in the source/drain recess. In some embodiments, a first epitaxial layer, a second epitaxial layer and a third epitaxial layer are formed. In other embodiments, no recess is formed and the epitaxial layers are formed over the fin structure.

In some embodiments, the first epitaxial layer includes SiP or SiCP for an n-type FinFET, and SiGe doped with B for a p-type FinFET, in the some embodiments. An amount of P (phosphorus) in the first epitaxial layer is in a range from about $1 \times 10^{18}$ atoms/cm$^3$ to about $1 \times 10^{20}$ atoms/cm$^3$, in some embodiments. The thickness of the first epitaxial layer is in a range of about 5 nm to 20 nm in some embodiments, and in a range of about 5 nm to about 15 nm in other embodiments. When the first epitaxial layer is SiGe, an amount of Ge is about 25 atomic % to about 32 atomic % in some embodiments, and is about 28 atomic % to about 30 atomic % in other embodiments. The second epitaxial layer includes SiP or SiCP for an n-type FinFET, and SiGe doped with B for a p-type FinFET, in some embodiments. In some embodiments, an amount of phosphorus in the second epitaxial layer is higher than the phosphorus amount of the first epitaxial layer and is in a range about $1 \times 10^{20}$ atoms/cm$^3$ to about $2 \times 10^{20}$ atoms/cm$^3$. The thickness of the second epitaxial layer is in a range of about 20 nm to 40 nm in this embodiment, or in a range of about 25 nm to about 35 nm in other embodiments. When the second epitaxial layer is SiGe, an amount of Ge is about 35 atomic % to about 55 atomic % in some embodiments, and is about 41 atomic % to about 46 atomic % in other embodiments. The third epitaxial layer includes a SiP epitaxial layer in some embodiments. The third epitaxial layer is a sacrificial layer for silicide formation in the source/drain. An amount of phosphorus in the third epitaxial layer is less than the phosphorus amount of the second epitaxial layer and is in a range of about $1 \times 10^{18}$ atoms/cm$^3$ to about $1 \times 10^{21}$ atoms/cm$^3$ in some embodiments. When the third epitaxial layer is SiGe, an amount of Ge is less than about 20 atomic % in some embodiments, and is about 1 atomic % to about 18 atomic % in other embodiments.

In at least one embodiment, the epitaxial layers 60 are epitaxially-grown by an LPCVD process, molecular beam epitaxy, atomic layer deposition or any other suitable method. The LPCVD process is performed at a temperature of about 400 to 850° C. and under a pressure of about 1 Torr to 200 Torr, using a silicon source gas such as $SiH_4$, $Si_2H_6$, or $Si_3H_8$; a germanium source gas such as $GeH_4$, or $G_2H_6$; a carbon source gas such as $CH_4$ or $SiH_3CH_3$ and phosphorus source gas such as $PH_3$.

Then, as shown in FIG. 4C, an interlayer dielectric (ILD) layer 50 is formed over the S/D epitaxial layer 60 and the dummy gate structure 40. The materials for the ILD layer 50 include compounds comprising Si, O, C and/or H, such as silicon oxide, SiCOH and SiOC. Organic materials, such as polymers, may be used for the ILD layer 50.

After the ILD layer 50 is formed, a planarization operation, such as chemical mechanical polishing (CMP), is performed, so that the top portion of the dummy gate electrode layer 44 is exposed, as shown in FIG. 4C. In some embodiments, before the ILD layer 50 is formed, a contact etch stop layer, such as a silicon nitride layer or a silicon oxynitride layer, is formed.

Figure 4D:
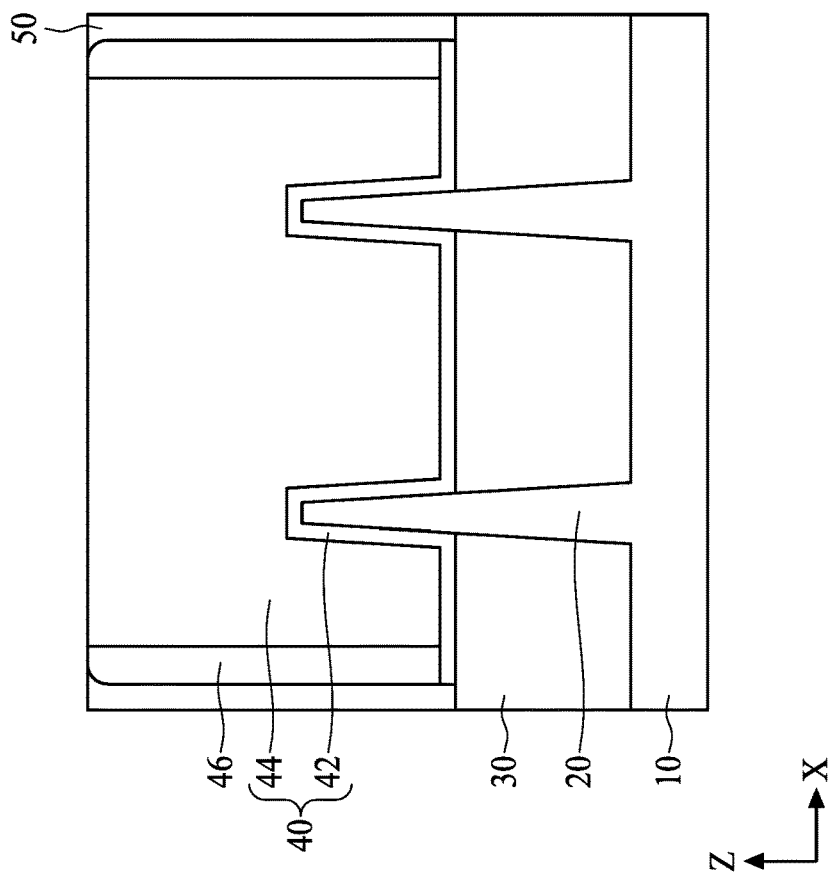

Then, the dummy gate electrode layer 44 and the dummy gate dielectric layer 42 are removed, thereby forming a gate space 47 as shown in FIG. 4D. The dummy gate structures can be removed using plasma dry etching and/or wet etching. When the dummy gate electrode layer 44 is polysilicon and the ILD layer 40 is silicon oxide, a wet etchant such as a TMAH solution can be used to selectively remove the dummy gate electrode layer 44. The dummy gate dielectric layer 42 is thereafter removed using plasma dry etching and/or wet etching.

Figure 5B:
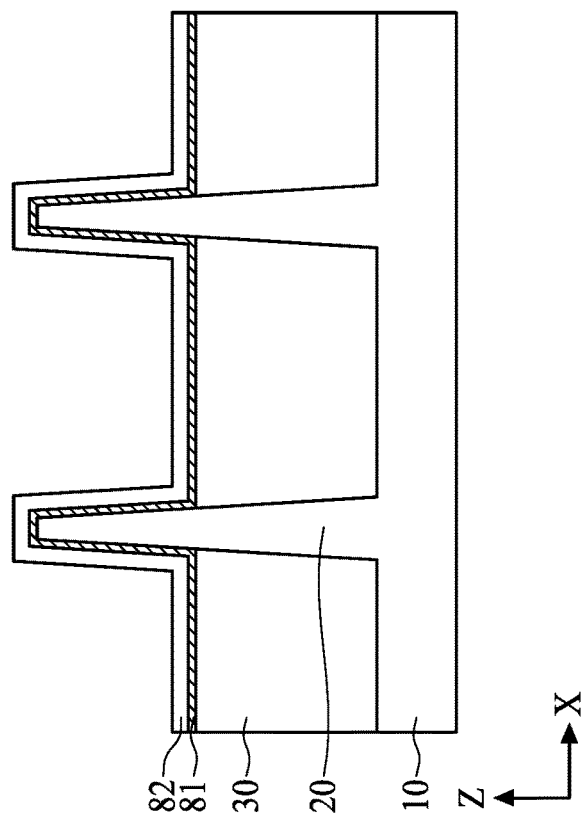
FIGS. 5A, 5B, 5C, 5D, 5E and 5F show cross sectional views of various stages of a sequential manufacturing process of a semiconductor device according to an embodiment of the present disclosure.
Figure 5A:
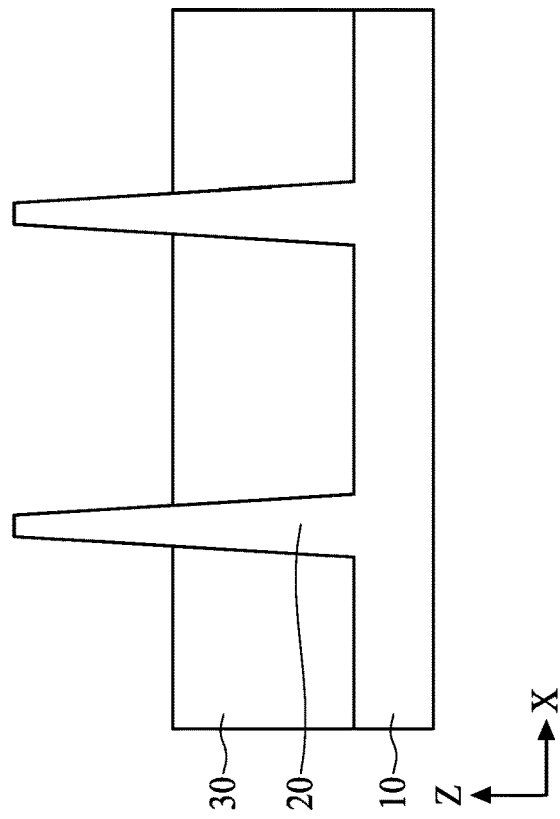

FIG. 5A shows the structure after the channel region of the fin structures 20 are exposed in the gate space 47. In FIGS. 5A-5F, the sidewall spacers 46 and the ILD layer 50 are omitted.

Figure 5C:
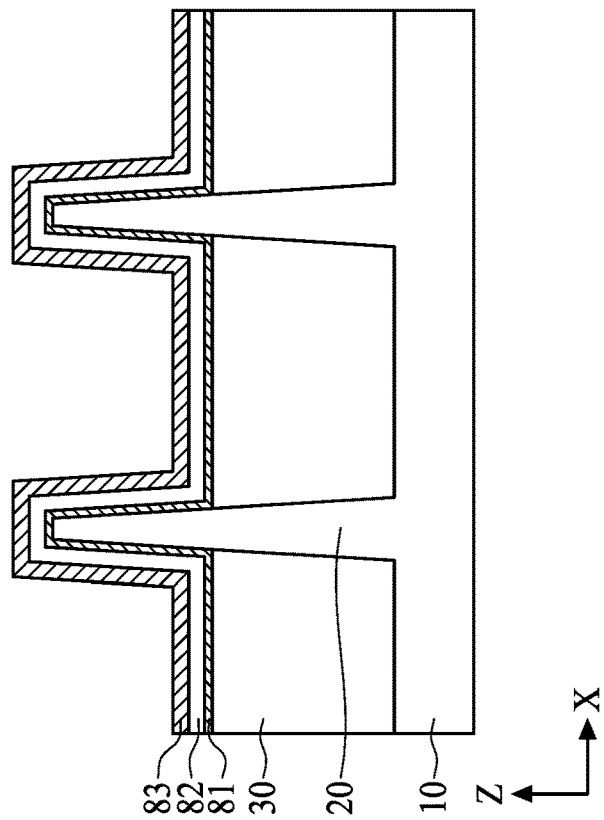
Figure 5D:
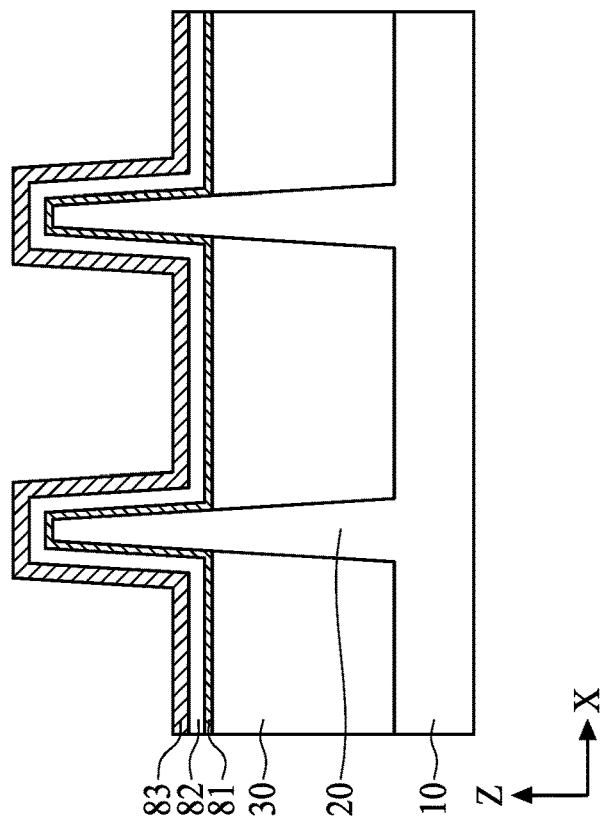
Figure 5F:
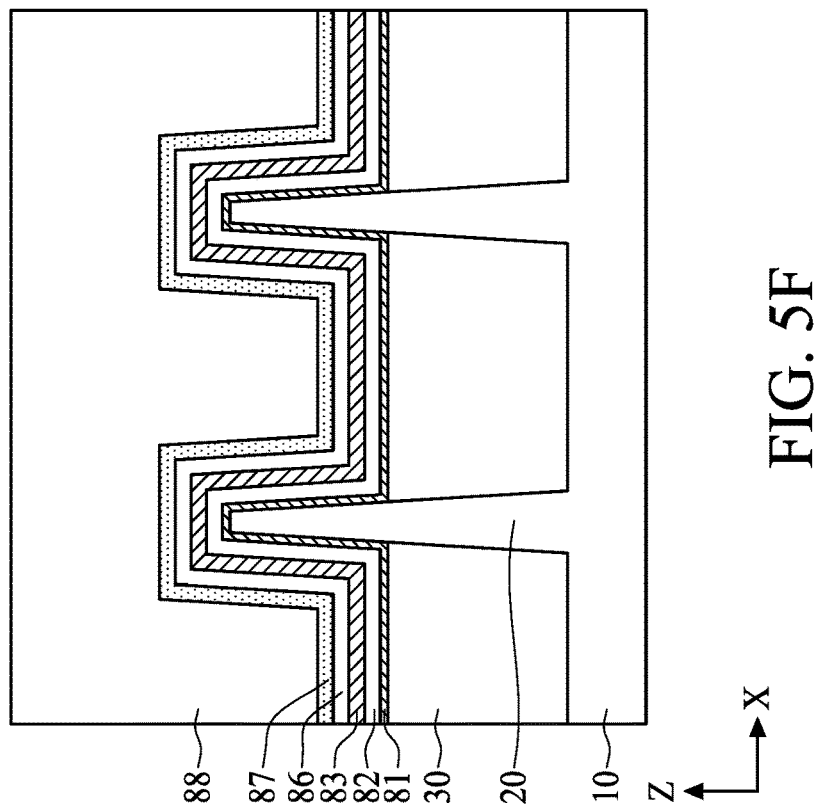
Figure 5E:
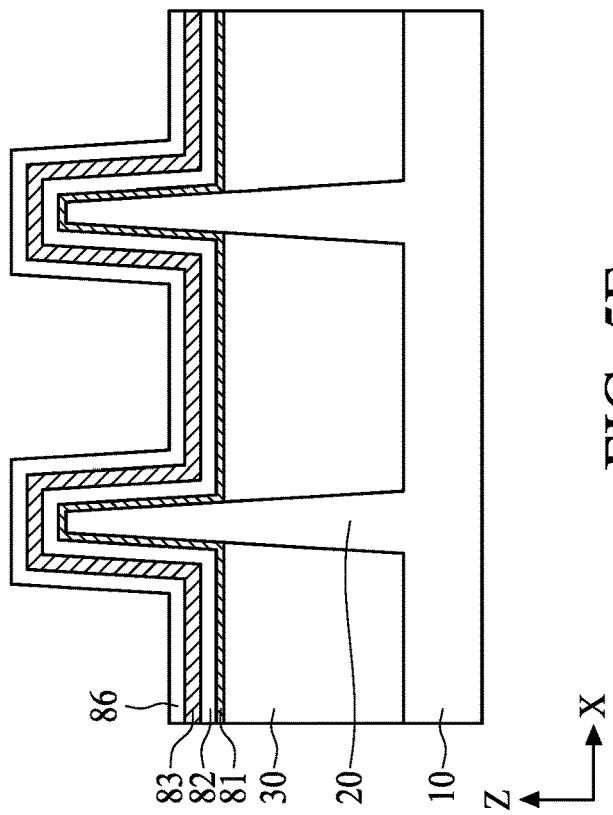
Figure 5G:
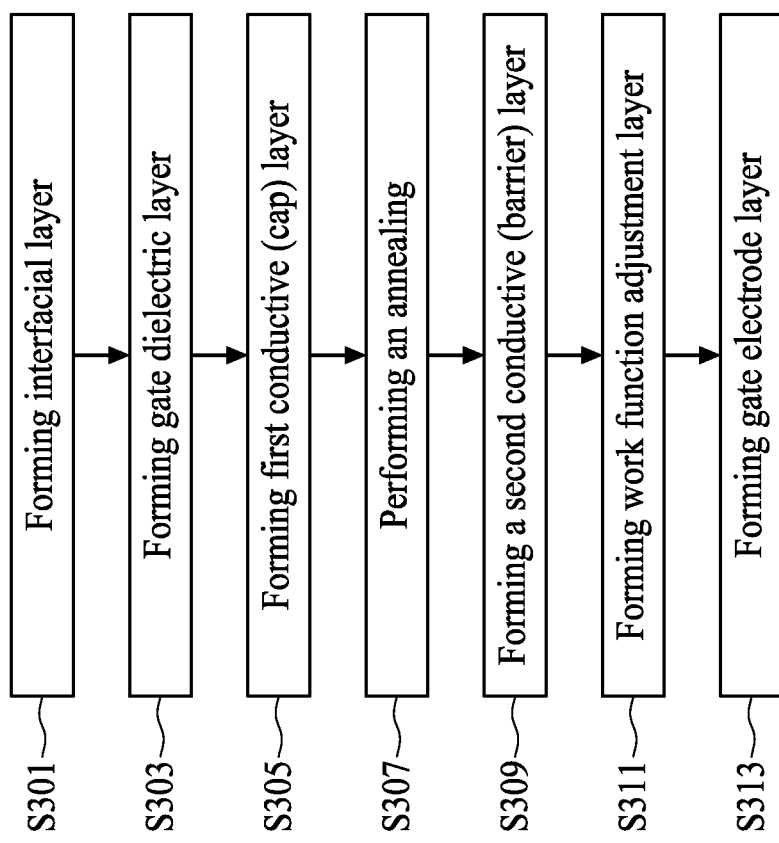
FIG. 5G shows a process flow of manufacturing a semiconductor device according to an embodiment of the present disclosure.

As shown in FIG. 5B, at S301 of FIG. 5G, an interfacial layer 81 is formed on the fin structure 20 and, at S303 of FIG. 5G, a gate dielectric layer 82 is formed on the interfacial layer 81. In some embodiments, the interfacial layer is formed by using chemical oxidation. In some embodiments, the interfacial layer 81 includes one of silicon oxide, silicon nitride and mixed silicon-germanium oxide. The thickness of the interfacial layer 81 is in a range from about 0.2 nm to about 6 nm in some embodiments. In some embodiments, the gate dielectric layer 82 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$ or other suitable high-k dielectric materials, and/or combinations thereof. The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layer. The thickness of the gate dielectric layer 82 is in a range from about 1 nm to about 100 nm in one embodiment.

Then, as shown in FIG. 5C, at S305 of FIG. 5G, a first conductive layer 83 is formed. The first conductive layer 83 can be formed by CVD, PVD, ALD or any suitable method in some embodiments. In some embodiments, the first conductive layer 83 is made of TiN or TiNSi.

In some embodiments, at S307 of FIG. 5G, after the first conductive layer 83 is formed, a first annealing operation is performed for about 1 nsec (spike annealing, such as a laser annealing) to about 360 sec at a temperature of about 600° C. to about 800° C. in some embodiments.

The first annealing can help to densify the gate dielectric layer 82 and to incorporate nitrogen into the gate dielectric layer 82. Nitrogen helps to passivate oxygen vacancies, reduces leakage and improves device reliability. The first annealing can also help to form a stable intermixing layer, which helps to provide a stable platform for subsequent metal gate film deposition onto the dielectric layer. When the temperature is too high, the first annealing may cause crystallization and grain boundary formation in the high-k gate dielectric layer 82, which impacts leakage performance and regrowth of the interfacial layer 81, which slows down device speed. In contrast, when the temperature is too low, the first annealing may not provide sufficient densification in the high-k gate dielectric layer and cause device instability/variations during subsequent metal gate deposition processes.

In some embodiments, the stacked structure including the interfacial layer 81, the gate dielectric layer 82 and the first conductive layer 83 is soaked in a fluorine containing gas (e.g., $F_2$ and/or $NF_3$) for about 4 sec to about 15 min at a temperature of about room temp (25° C.) to about 550° C. in some embodiments. Incorporation of fluorine helps to improve the work function adjustment property, decrease Vt of a PFET device, passivate oxygen vacancies in the gate dielectric layer 82, reduce leakage and reduce dangling bonds in the gate dielectric layer. Thereafter, a capping layer made of, for example a crystalline, polycrystalline or amorphous Si, is formed over the first conductive layer 83, and a second annealing operation is performed for about 1 nsec (spike annealing, such as a laser annealing) to about 360 sec at a temperature of about 550° C. to about 1300° C. in some embodiments. In some embodiments, the annealing temperature is from 900° C. to 1100° C. This results in the diffusion of the fluorine into the capping layer, the first conductive layer 83 and the gate dielectric layer 82 in some embodiments. After the second annealing operation, the capping layer is removed. The second annealing with the Si capping layer also helps to improve the quality of the gate dielectric layer 82. A gate dielectric layer, such as a high-k dielectric layer, is formed at a relatively low temperature to avoid crystallization and grain boundary formation, while metal gate films are deposited at relatively higher temperatures. Accordingly, it is desirable to make the high-k dielectric layer more thermally stable before the metal gate deposition. The second annealing with the capping layer at the temperature ranges as set forth above can densify the high-k dielectric layer, and make it thermally stable, without any thermal oxide inversion during the metal gate deposition. The second annealing also helps to thermally in-diffuse the fluorine from the outer layers (e.g., the capping layer) into the first conductive layer 83, the gate dielectric layer 82 and the interfacial layer 81. The capping layer is used to protect the gate dielectric layer 82 and the first conductive layer 83 from undesirable oxidation damage and to isolate these films from the annealing atmosphere. After thermal stabilization of the gate dielectric layer, the capping layer is no longer required in the final device structure and therefore it is removed.

In other embodiments, no fluorine soaking operation accompanying formation of a Si capping layer and a second annealing operation is performed.

Subsequently, at S311 of FIG. 5G, one or more WFM layers 86 are formed. A metal gate layer including a glue layer 87 and a body metal layer (gate electrode layer) 88 is formed above the work function adjustment layer 86, at S313 of FIG. 5G. The work function adjustment material (WFM) layer can be formed by ALD, PVD, CVD, e-beam evaporation, or other suitable process. Further, the WFM layer can be formed separately for the n-channel FET and the p-channel FET which may use different metal layers. The gate electrode layer (body metal layer) 88 and the glue layer 87 can be formed by CVD, ALD, electro-plating, or other suitable method.

In some embodiments, at S309 of FIG. 3G, a second conductive layer 84 (not shown in FIGS. 5A-5F) is optionally formed.

FIGS. 6A, 6B and 6C show various configuration of a gate stack according to embodiments of the present disclosure. FIGS. 6A-6C show cross section views of gate structures for n-type FETs with different threshold voltages according to embodiments of the present disclosure. In some embodiments, a semiconductor device includes a first n-type FET formed in a first n-type FET region N1, a second n-type FET formed in a second n-type region N2, and a third n-type FET formed in a third n-type region N3. A threshold voltage of the first n-type FET is smaller in an absolute value than a threshold voltage of the second n-type FET, and the threshold voltage of the second n-type FET is smaller in an absolute value than a threshold voltage of the third n-type FET. In some embodiments, a gate length (a length in the Y direction in FIGS. 1C, 2C and 3C) of the first n-type FET is smaller than a gate length of the second n-type FET and the gate length of the second n-type FET is smaller than a gate length of the third n-type FET.

In some embodiments, as shown in FIG. 6A, the gate structure of the first n-type FET N1 includes, closer to a channel region 20, an interfacial layer 81, a gate dielectric layer 82, a first conductive layer (a first barrier layer) 83, an n-type WFM layer 100, a glue layer 87 and a body metal layer 88, stacked in this order. One or more additional layers may be included. In some embodiments, the gate structure of the second n-type FET N2 includes, closer to a channel region 20, an interfacial layer 81, a gate dielectric layer 82, a first conductive layer (a first barrier layer) 83, a second conductive layer (a second barrier layer) 84, a first p-type WFM layer 89-1, an n-type WFM layer 100, a glue layer 87 and a body metal layer 88, stacked in this order. One or more additional layers may be included. In some embodiments, the gate structure of the third n-type FET N3 includes, closer to a channel region 20, an interfacial layer 81, a gate dielectric layer 82, a first conductive layer (a first barrier layer) 83, a second conductive layer (a second barrier layer) 84, a first p-type WFM layer 89-1, a second p-type WFM layer 89-2, an n-type WFM layer 100, a glue layer 87 and a body metal layer 88, stacked in this order. One or more additional layers may be included. The gate structure for the first n-type FET N1 includes no second barrier layer and no p-type WFM layer.

In some embodiments, as shown in FIG. 6B, the thickness of the first conductive layer 83 of the first n-type FET N1 is smaller than the thickness of the first conductive layer 83 of the second and third n-type FETs N2 and N3.

In some embodiments, as shown in FIG. 6C, the gate structure for the first n-type FET N1 includes no first barrier layer and the n-type WFM layer 100 is in direct contact with the gate dielectric layer 82.

The n-type WFM layer 100 is made of different material than the first and second p-type WFM layers 89-1, 89-2. In some embodiments, the n-type WFM layer 100 is made of a material having a low work function in a range from about 2.5 eV to 4.4 eV and a p-type WFM layer is made of a material having a high work function in a range from about 4.3 eV to 5.8 eV. In some embodiments, the n-type WFM layer 100 includes aluminum. In some embodiments, the first n-type WFM layer includes one or more of TiAl, TiAlC, TaAl and TaAlC. In some embodiments, the first and second p-type WFM layer 89-1, 89-2 includes metal nitride, such as TiN, MoN, WCN and WN. In some embodiments, the first p-type WFM layer 89-1 is made of the same material as the second p-type WFM layer 89-2. When the first p-type WFM layer 89-1 is made of the same material as the second p-type WFM layer 89-2, the third n-type FET N3 includes a single layer of a p-type WFM having a thickness greater than a p-type WFM layer (89-2) for the second n-type FET N2. In other embodiments, the first p-type WFM layer 89-1 is made of a different material than the second p-type WFM layer 89-2.

In some embodiments, a thickness of the n-type WFM layer 100 is in a range from about 0.6 nm to about 40 nm, and is in a range from about 1 nm to about 20 nm in other embodiments. The thickness of the n-type WFM layer 100 affects the threshold voltages of n-type FETs. In some embodiments, a thickness of the first and second p-type WFM layers 89-1, 89-1 is in a range from about 0.5 nm to about 20 nm, and is in a range from about 1 nm to about 10 nm in other embodiments. The thickness of the p-type WFM layers affects the threshold voltages of n-type FETs.

In some embodiments, the glue layer 87 is made of TiN, Ti and/or Co. In some embodiments, the body metal layer 88 is made of W, Al, Co, or any other suitable metal material.

FIGS. 7A, 7B, 7C, 7D, 7E and 7F show cross sectional views of various stages of a sequential manufacturing process of a semiconductor device according to embodiments of the present disclosure. It is understood that in the sequential manufacturing process, one or more additional operations can be provided before, during, and after the stages shown in FIGS. 7A-7F, and some of the operations described below can be replaced or eliminated for additional embodiments of the method. The order of the operations/processes may be interchangeable.

As shown in FIG. 7A, an interfacial layer 81 is formed on each of the channel regions 20 of the first to third n-type FETs. A gate dielectric layer (e.g., a high-k gate dielectric layer) 82 is formed on the interfacial layer 81. A first conductive layer, as a first barrier layer 83, is formed on the gate dielectric layer 82. A second conductive layer, as a second barrier layer 84, is formed on the first conductive layer 83. Further, a first p-type WFM layer 89-1 and a second p-type WFM layer 89-2 are sequentially formed on the second conductive layer 84.

Then, by using one or more lithography and etching operations, the second p-type WFM layer 89-2 is removed from the first and second n-type FET regions N1, N2, as shown in FIG. 7B. In some embodiments, a plasma etching operation is performed. The plasma etching operation utilizes a gas including $N_2$ and $H_2$, a gas including $O_2/Cl_2$ and/or an $O_2$ gas.

Next, in some embodiments, a bottom antireflective layer 200 made of an organic material is formed and a photo resist layer 205 is formed on the bottom antireflective layer 200. By using one or more lithography operations, the photo resist layer 205 is patterned, to expose the bottom antireflective layer 200 in the first p-type FET region N. Then, the exposed bottom antireflective layer 200 is removed by one or more plasma etching operations, to expose the first p-type WFM layer 89-1, as shown in FIG. 7C. The second and third n-type FET regions are protected by the photo resist layer 205 and the bottom antireflective layer 200. In some embodiments, only the bottom antireflective layer 200 covers the second and third n-type FET regions.

Then, one or more etching operations are performed to remove the first WFM layer 89-1 and the second conductive layer 84 from the first n-type FET region N1. In some embodiments, a wet etching operation is performed to remove the first WFM layer 89-1 and the second conductive layer 84 together, as shown in FIG. 7D. In some embodiments, the wet etching operation is a one-step operation using a wet etchant. In some embodiments, the wet etchant is an aqueous solution of HCl and $H_2O_2$, an aqueous solution of $NH_4OH$ and $H_2O_2$, an aqueous solution of HCl, $NH_4OH$ and $H_2O_2$, an aqueous solution of HF, $NH_4OH$ and $H_2O_2$ and/or an aqueous solution of $H_3PO_4$ and $H_2O_2$.

Then, as shown in FIG. 7E, the photo resist layer 205 and the bottom antireflective layer 200 are removed. Further, an n-type WFM layer 100 is formed on the first conductive layer 83 in the first n-type FET region N1, on the first p-type WFM layer 89-1 in the second n-type FET region N2, and on the second p-type WFM layer 89-2 in the third n-type FET region N3, as shown in FIG. 7F.

In some embodiments, during the wet etching operation to remove the first WFM layer 89-1 and the second conductive layer 84, the first barrier layer 83 is also partially removed. In such a case, the thickness of the first conductive layer 83 of the first n-type FET N1 is smaller than the thickness of the first conductive layer 83 of the second and third v-type FETs N2 and N3, as shown in FIG. 6B. In some embodiments, the first conductive layer 83 is fully removed in the wet etching operation.

Figures 8A, 8B, 8C:
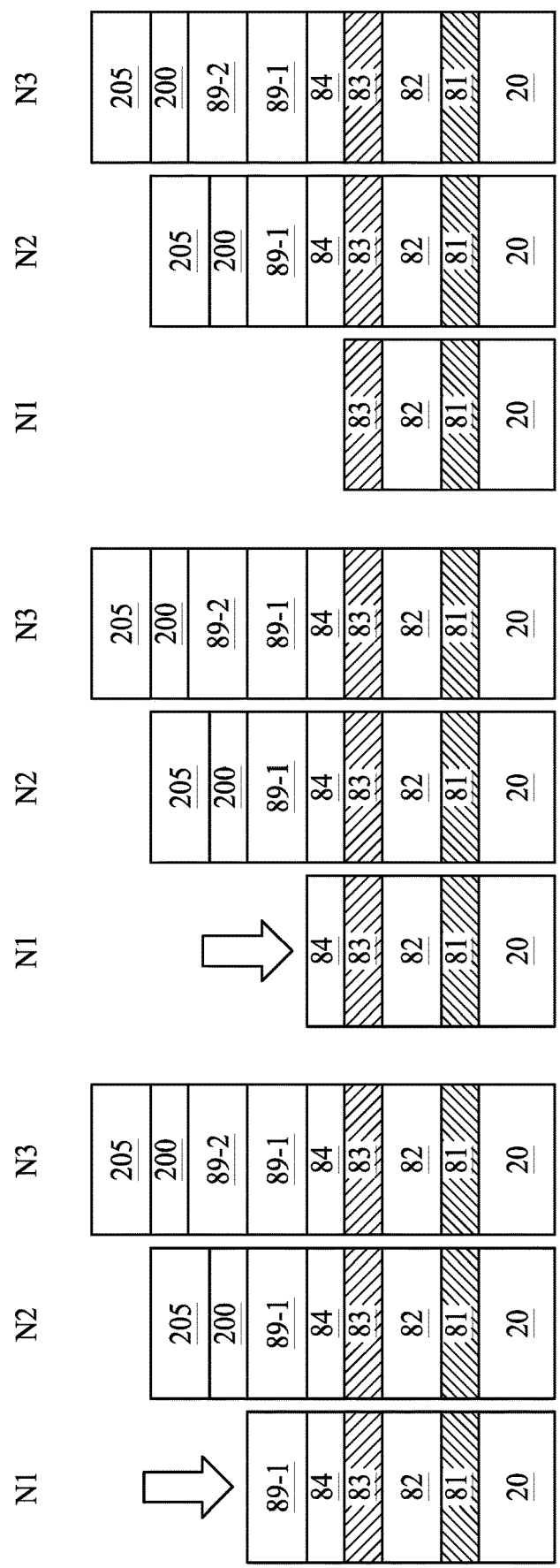
FIGS. 8A, 8B and 8C show cross sectional views of various stages of a sequential manufacturing process of a semiconductor device according to embodiments of the present disclosure.

FIGS. 8A, 8B and 8C show cross sectional views of various stages of a sequential manufacturing process of a semiconductor device according to another embodiment of the present disclosure.

In the embodiment, of FIGS. 8A-8C, two step wet etching operations are performed to remove the first WFM layer 89-1 and the second conductive layer 84. The structure of FIG. 8A is the same as the structure of FIG. 7C. A first wet etching operation is performed to remove the first WFM layer 89-1. In some embodiments, the first wet etchant is an aqueous solution of HCl and $H_2O_2$, an aqueous solution of the combination of $NH_4OH$ and $H_2O_2$, an aqueous solution of the combination of HCl, $NH_4OH$ and $H_2O_2$, an aqueous solution of HF, $NH_4OH$ and $H_2O_2$ and/or an aqueous solution of $H_3PO_4$ and $H_2O_2$. Then, a second wet etching operation is performed to remove the second conductive layer 84. The second wet etchant is different from the first wet etchant and is an aqueous solution of HCl and $H_2O_2$, an aqueous solution of $NH_4OH$ and $H_2O_2$, an aqueous solution of HCl, $NH_4OH$ and $H_2O_2$, an aqueous solution of HF, $NH_4OH$ and $H_2O_2$ and/or an aqueous solution of $H_3PO_4$ and $H_2O_2$. After the second conductive layer 84 is removed from the first n-type FET region N1 as shown in FIG. 8C, the photo resist layer 205 and the bottom antireflective layer 200 are removed. Further, an n-type WFM layer 100 is formed on the first conductive layer 83 in the first n-type FET region N1, on the first p-type WFM layer 89-1 in the second n-type FET region N2, and on the second p-type WFM layer 89-2 in the third n-type FET region N3, similar to FIGS. 7E and 7F.

In some embodiments, the first conductive layer 83 is also partially etched or fully removed in the second wet etching operation.

FIGS. 9A, 9B, 9C and 9D show cross sectional views of various stages of a sequential manufacturing process of a semiconductor device according to embodiments of the present disclosure.

Figure 9B:
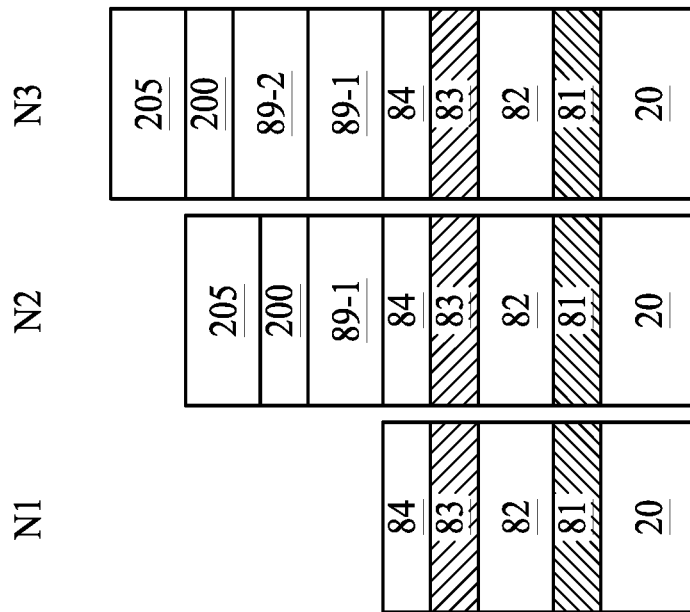
FIGS. 9A, 9B, 9C and 9D show cross sectional views of various stages of a sequential manufacturing process of a semiconductor device according to embodiments of the present disclosure.
Figure 9A:
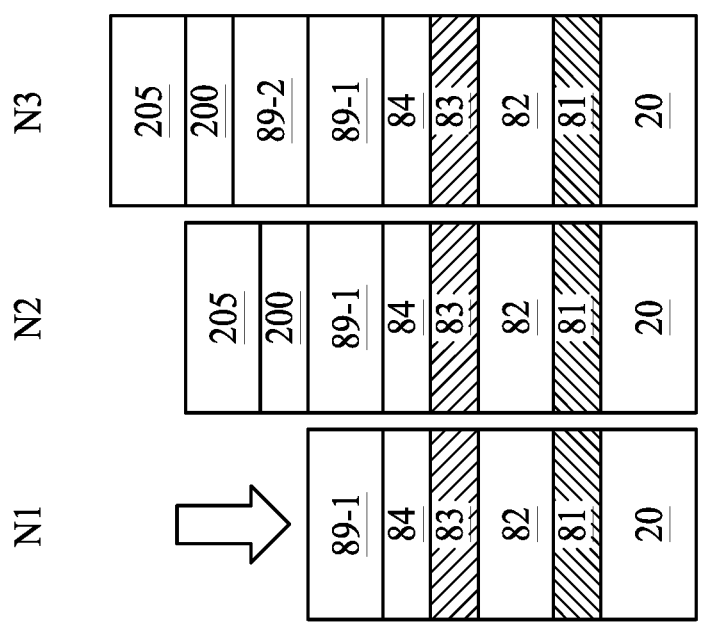
Figure 9D:
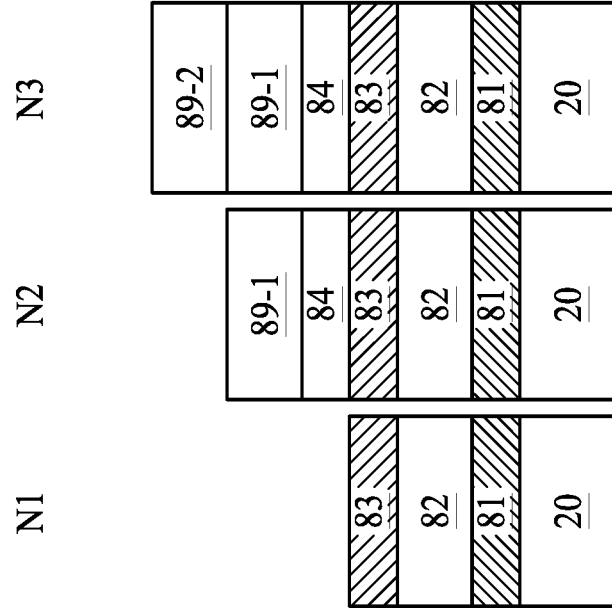
Figure 9C:
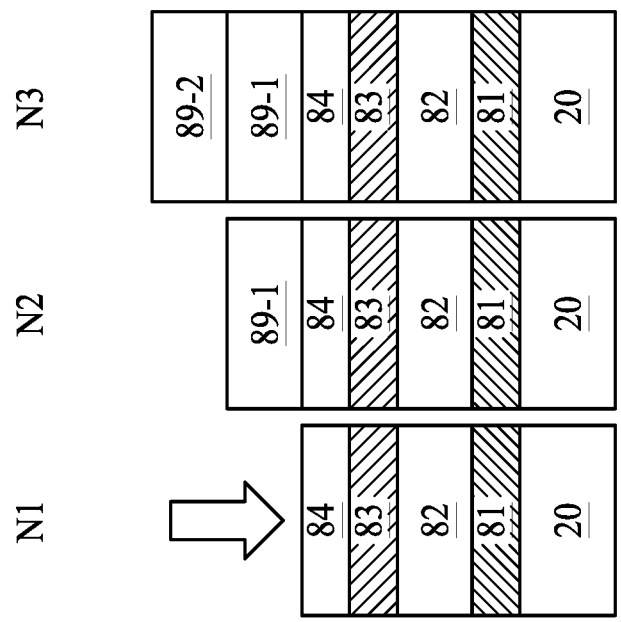

In the embodiment, of FIGS. 9A-9C, two step etching operations are performed to remove the first WFM layer 89-1 and the second conductive layer 84.

The structure of FIG. 9A is the same as the structure of FIG. 7C. A first wet etching operation is performed to remove the first WFM layer 89-1. In some embodiments, the first wet etchant is an aqueous solution of HCl and $H_2O_2$, an aqueous solution of $NH_4OH$ and $H_2O_2$, an aqueous solution of HCl, $NH_4OH$ and $H_2O_2$, an aqueous solution of HF, $NH_4OH$ and $H_2O_2$ and/or an aqueous solution of $H_3PO_4$ and $H_2O_2$. After the first p-type WFM layer 89-1 is removed from the first n-type FET region N1 as shown in FIG. 9B, the photo resist layer 205 and the bottom antireflective layer 200 are removed as shown in FIG. 9C.

Then, a second wet etching operation is performed to remove the second conductive layer 84, as shown in FIG. 9C. The second wet etchant is an aqueous solution of HCl and $H_2O_2$, an aqueous solution of $NH_4OH$ and $H_2O_2$, an aqueous solution of HCl, $NH_4OH$ and $H_2O_2$, an aqueous solution of HF, $NH_4OH$ and $H_2O_2$ and/or an aqueous solution of $H_3PO_4$ and $H_2O_2$. In some embodiments, the second etchant is different from the first wet etchant.

In some embodiments, the second conductive layer 84 is removed by a dry etching operation using a gas containing tungsten chloride ($WCl_x$, x=2, 3, 4, 5, or 6) and/or HCl. In some embodiments, the dry etching is chemical etching without using plasma and with heating the substrate at 400° C. to 600° C. In other embodiments, the dry etching is plasma dry etching.

Further, after the second conductive layer 84 is removed, an n-type WFM layer 100 is formed on the first conductive layer 83 in the first n-type FET region N1, on the first p-type WFM layer 89-1 in the second n-type FET region N2, and on the second p-type WFM layer 89-2 in the third n-type FET region N3, similar to FIGS. 7E and 7F.

In some embodiments, the first conductive layer 83 is also partially etched or fully removed in the second wet etching operation.

FIGS. 10A, 10B, 10C and 10D show cross sectional views of various stages of a sequential manufacturing process of a semiconductor device according to embodiments of the present disclosure.

Figures 10A, 10B:
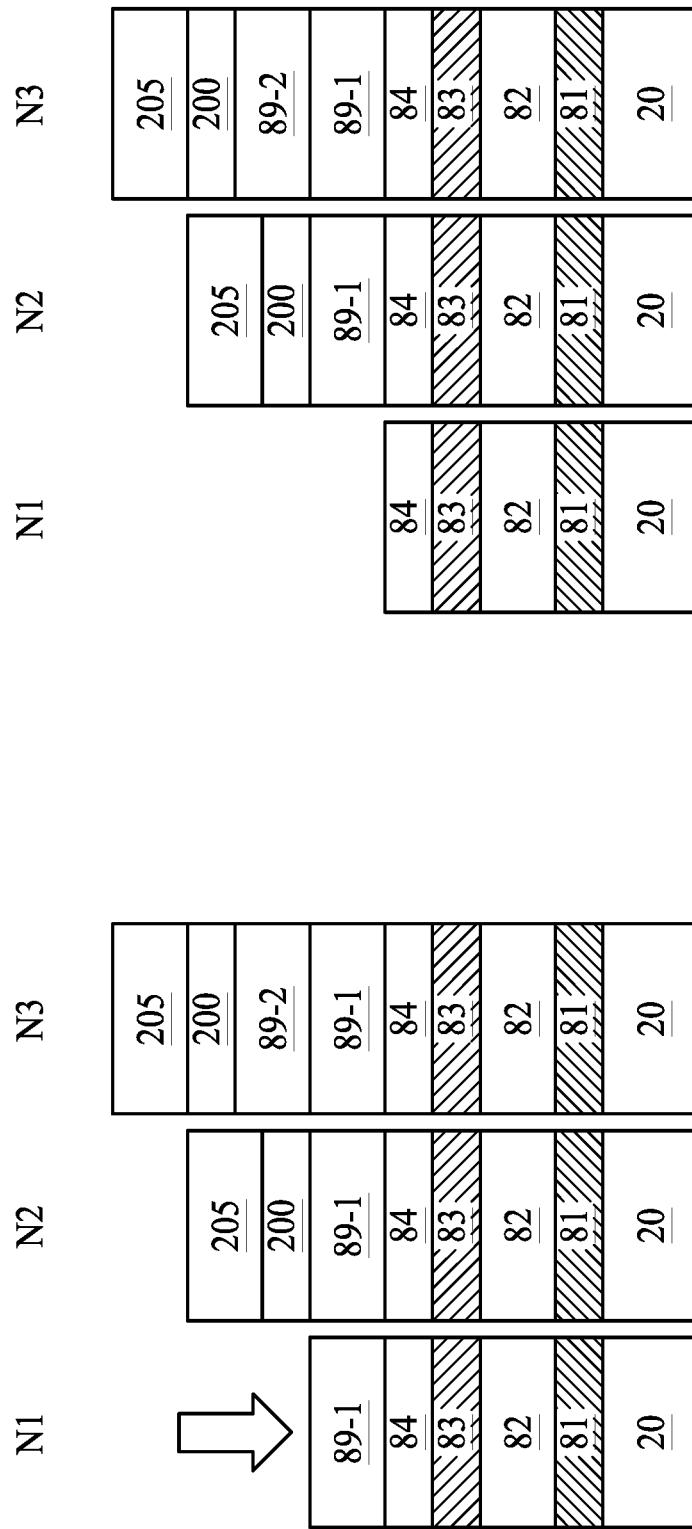
FIGS. 10A, 10B, 10C and 10D show cross sectional views of various stages of a sequential manufacturing process of a semiconductor device according to embodiments of the present disclosure.
Figure 10D:
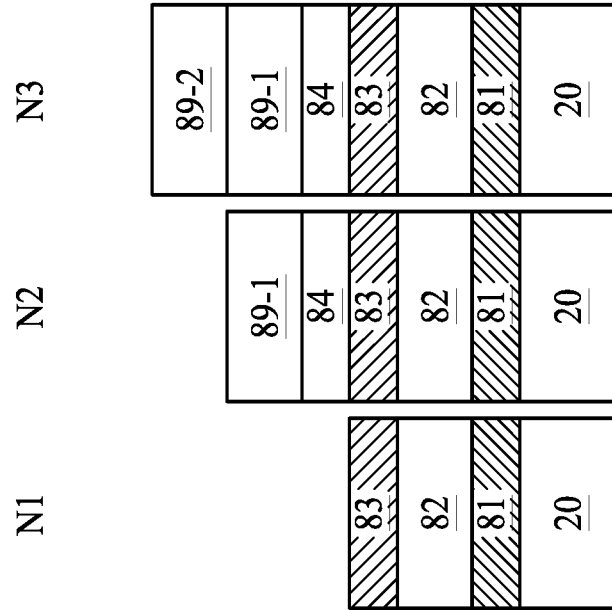
Figure 10C:
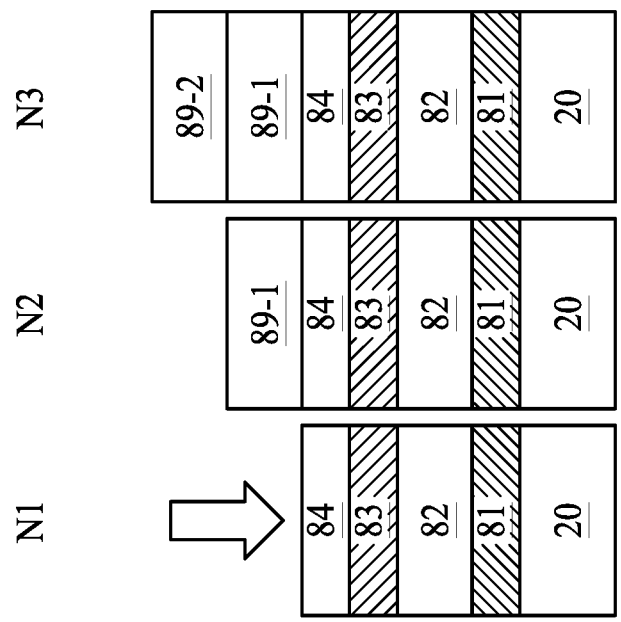

In the embodiment of FIGS. 10A-10C, two step etching operations are performed to remove the first WFM layer 89-1 and the second conductive layer 84.

The structure of FIG. 10A is the same as the structure of FIG. 7C. A first plasma dry etching operation is performed to remove the first WFM layer 89-1. The plasma dry etching utilizes a gas including $N_2$ and $H_2$, a gas including $O_2/Cl_2$ and/or an $O_2$ gas. After the first p-type WFM layer 89-1 is removed from the first n-type FET region N1 as shown in FIG. 10B, the photo resist layer 205 and the bottom antireflective layer 200 are removed as shown in FIG. 10C.

Then, a second wet etching operation is performed to remove the second conductive layer 84, as shown in FIG. 10C. The second wet etchant is an aqueous solution of HCl and $H_2O_2$, an aqueous solution of $NH_4OH$ and $H_2O_2$, an aqueous solution of HCl, $NH_4OH$ and $H_2O_2$, an aqueous solution of HF, $NH_4OH$ and $H_2O_2$ and/or an aqueous solution of $H_3PO_4$ and $H_2O_2$. In some embodiments, the second wet etchant is different from the first wet etchant.

In some embodiments, the second conductive layer 84 is removed by a dry etching operation using a gas containing tungsten chloride ($WCl_x$, x=2, 3, 4, 5, or 6) and/or HCl. In some embodiments, the dry etching is chemical etching without using plasma and with heating the substrate at 400° C. to 600° C. In other embodiments, the dry etching is plasma dry etching.

Further, after the second conductive layer 84 is removed, an n-type WFM layer 100 is formed on the first conductive layer 83 in the first n-type FET region N1, on the first p-type WFM layer 89-1 in the second n-type FET region N2, and on the second p-type WFM layer 89-2 in the third n-type FET region N3, similar to FIGS. 7E and 7F.

In some embodiments, the first conductive layer 83 is also partially etched or fully removed in the second wet etching operation.

In the present disclosure, since at least the second barrier layer is removed from a first n-type FET region, it is possible to obtain a broader gate space into which a WFM layer is formed. Thus, it is possible to obtain a more uniform threshold voltage in an n-type FET. In addition, since the second barrier layer is removed with a wet etching operation or non-plasma etching operation (chemical dry etching), it is possible to prevent plasma damage to the underlying layer and/or other FET regions.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a gate dielectric layer is formed over a channel region made of a semiconductor material, a first barrier layer is formed on the gate dielectric layer, a second barrier layer is formed on the first barrier layer, a first work function adjustment layer is formed on the second barrier layer, the first work function adjustment layer and the second barrier layer are removed. After the first work function adjustment layer and the second barrier layer are removed, a second work function adjustment layer is formed over the gate dielectric layer, and a metal gate electrode layer is formed over the second work function adjustment layer. In one or more of the foregoing and following embodiments, the first barrier layer is made of TiN or TiN doped with Si and the second barrier layer is made of TaN. In one or more of the foregoing and following embodiments, the first work function adjustment layer is made of TiN, and the second work function adjustment layer is made of one selected from the group consisting of TiAl, TiAlC, TaAl, TaAlC and TiAlN. In one or more of the foregoing and following embodiments, the first work function adjustment layer and the second barrier layer are removed together by a wet etching operation. In one or more of the foregoing and following embodiments, an etchant of the wet etching operation includes at least one selected from the group consisting of $NH_4OH$, $H_2O_2$ and HCl. In one or more of the foregoing and following embodiments, the first work function adjustment layer is removed by a first etching operation and the second barrier layer is removed by a second etching operation using a different etchant than the first etching operation. In one or more of the foregoing and following embodiments, the first etching is a wet etching using a first etchant and the second etching is a wet etching using a second etchant. In one or more of the foregoing and following embodiments, the first and second etchants include at least one selected from the group consisting of $NH_4OH$, $H_2O_2$ and HCl, and the first etchant is different from the second etchant. In one or more of the foregoing and following embodiments, the first etching is a wet etching using a first etchant and the second etching is a dry etching using a second etchant, the first etchant include at least one selected from the group consisting of $NH_4OH$, $H_2O_2$ and HCl, and the second etchant includes a gas containing at least one selected from the group consisting of $WCl_x$ and HCl. In one or more of the foregoing and following embodiments, when the first work function adjustment layer and the second barrier layer are removed, a part of the first barrier layer is removed, and the second work function adjustment layer is formed on the first barrier layer. In one or more of the foregoing and following embodiments, after the first work function adjustment layer and the second barrier layer are removed, the first barrier layer is removed. The second work function adjustment layer is formed on the gate dielectric layer.

In accordance with another aspect of the present disclosure, in a method of manufacturing a semiconductor device including a first n-type field effect transistor (NFET) and a second NFET, a gate dielectric layer is formed over a channel region made of a semiconductor material of each of a first NFET region and a second NFET region, a first barrier layer is formed on the gate dielectric layer, a second barrier layer is formed on the first barrier layer, a first work function adjustment layer is formed on the second barrier layer, the first work function adjustment layer and the second barrier layer are removed from the first NFET region, while maintain the first work function adjustment layer and the second barrier layer in the second NFET region, after the first work function adjustment layer and the second barrier layer are removed from the first NFET region, a second work function adjustment layer is formed in the first and second NFET regions, and a metal gate electrode layer is formed over the second work function adjustment layer. In one or more of the foregoing and following embodiments, the first barrier layer is made of TiN or TiN doped with Si and the second barrier layer is made of TaN. In one or more of the foregoing and following embodiments, the first work function adjustment layer is made of TiN, and the second work function adjustment layer is made of one selected from the group consisting of TiAl, TiAlC, TaAl, TaAlC and TiAlN. In one or more of the foregoing and following embodiments, the first work function adjustment layer and the second barrier layer are removed in the first NFET region together by a wet etching operation. In one or more of the foregoing and following embodiments, the first work function adjustment layer is removed by a first wet etching operation and the second barrier layer is removed by a second wet etching operation using a different etchant than the first wet etching operation, in the first NFET region. In one or more of the foregoing and following embodiments, when the first work function adjustment layer and the second barrier layer are removed in the first NFET region, a part of the first barrier layer is removed, the second work function adjustment layer is formed on the first barrier layer in the first NFET region, and a thickness of the first barrier layer in the first NFET region is smaller than a thickness of the first barrier layer in the second NFET region. In one or more of the foregoing and following embodiments, after the first work function adjustment layer and the second barrier layer are removed in the first NFET region, the first barrier layer is removed in the first NFET region, and the second work function adjustment layer is formed on the gate dielectric layer in the first NFET region. In one or more of the foregoing and following embodiments, when the first work function adjustment layer and the second barrier layer are removed from the first NFET region, the second NFET region is covered by one or more organic layers.

In accordance with another aspect of the present disclosure, in a method of manufacturing a semiconductor device including a first n-type field effect transistor (NFET), a second NFET and a third NFET, a gate dielectric layer is formed over a channel region made of a semiconductor material of each of a first NFET region, a second NFET region and a third NFET region, a first barrier layer is formed on the gate dielectric layer, a second barrier layer is formed on the first barrier layer, a first work function adjustment layer is formed on the second barrier layer, a second work function adjustment layer is formed on the first work function adjustment layer, the second work function adjustment layer is removed from the first and second NFET regions and maintaining the second work function adjustment layer in the third NFET region, the first work function adjustment layer and the second barrier layer are removed from the first NFET region, after the first work function adjustment layer and the second barrier layer are removed from the first NFET region, a third work function adjustment layer is formed in the first, second and third NFET regions, and a metal gate electrode layer is formed over the third work function adjustment layer. In one or more of the foregoing and following embodiments, the first work function adjustment layer is removed by a first wet etching operation using a first etchant in the first NFET region, while the second and third NFET regions are covered by one or more organic layers, and the second barrier layer is removed in the first NFET region by a second wet etching operation using a second etchant different from the first etchant, and the second and third NFET regions are exposed to the second etchant. In one or more of the foregoing and following embodiments, the first work function adjustment layer is removed by a dry etching operation in the first NFET region, while the second and third NFET regions are covered by one or more organic layers, and the second barrier layer is removed in the first NFET region by a wet etching operation using an aqueous etchant, and the second and third NFET regions are exposed to the aqueous etchant.

In accordance with one aspect of the present disclosure, a semiconductor device includes a gate structure disposed over a channel region, and a source/drain region. The gate structure includes a gate dielectric layer over the channel region, a work function adjustment layer in direct contact with the gate dielectric layer, a metal gate electrode layer disposed over the work function adjustment layer. The work function adjustment layer includes aluminum. In one or more of the foregoing and following embodiments, the work function adjustment layer is made of one selected from the group consisting of TiAl, TiAlC, TaAl, TaAlC and TiAlN. In one or more of the foregoing and following embodiments, the metal gate electrode layer includes a glue layer and a body metal layer.

In accordance with another aspect of the present disclosure, a semiconductor device includes a first field effect transistor (FET) including a first gate structure disposed over a first channel region, and a second FET including a second gate structure disposed over a second channel region. A threshold voltage of the first FET is different from a threshold voltage of the second FET. Each of the first and second gate structures includes a gate dielectric layer, a first work function adjustment layer over the gate dielectric layer, and a metal gate electrode layer disposed over the first work function adjustment layer. The second gate structure further includes a first barrier layer below the first work function adjustment layer, and the first gate structure includes no first barrier layer. In one or more of the foregoing and following embodiments, the first and second gate structures further include a second barrier layer on the gate dielectric layer. In one or more of the foregoing and following embodiments, a thickness of the second barrier layer in the first gate structure is smaller than a thickness of the second barrier layer in the second gate structure. In one or more of the foregoing and following embodiments, the second barrier layer is made of TiN or TiN doped with Si and the first barrier layer is made of TaN. In one or more of the foregoing and following embodiments, the second gate structure further includes a second barrier layer between the first barrier layer and the gate dielectric layer, and the first gate structure includes no second barrier layer. In one or more of the foregoing and following embodiments, the second gate structure further includes a second work function adjustment layer made of a different material than the first work function adjustment layer, and the first gate structure includes no second work function adjustment layer. In one or more of the foregoing and following embodiments, the first work function adjustment layer includes aluminum, and the second work function adjustment layer includes TiN. In one or more of the foregoing and following embodiments, the metal gate electrode layer includes a glue layer and a body metal layer. In one or more of the foregoing and following embodiments, the first FET is a fin FET including a fin structure, a part of which is the first channel region, and the second FET is a fin FET including a fin structure, a part of which is the second channel region.

In accordance with another aspect of the present disclosure, a semiconductor device includes a first field effect transistor (FET) including a first gate structure disposed over a first channel region, a second FET including a second gate structure disposed over a second channel region, and a third FET including a third gate structure disposed over a third channel region. A threshold voltage of the first FET is smaller, in an absolute value, than a threshold voltage of the second FET, and the threshold voltage of the second FET is smaller, in an absolute value, than a threshold voltage of the third FET. Each of the first, second and third gate structures includes a gate dielectric layer, a first work function adjustment layer over the gate dielectric layer, and a metal gate electrode layer disposed over the first work function adjustment layer. The second and third gate structures further include a first barrier layer below the first work function adjustment layer, and the first gate structure includes no first barrier layer. In one or more of the foregoing and following embodiments, the first, second and third gate structures further include a second barrier layer on the gate dielectric layer. In one or more of the foregoing and following embodiments, a thickness of the second barrier layer in the first gate structure is smaller than a thickness of the second barrier layer in the second gate structure and the third gate structure. In one or more of the foregoing and following embodiments, the second barrier layer is made of TiN or TiN doped with Si and the first barrier layer is made of TaN. In one or more of the foregoing and following embodiments, the second and third gate structure further includes a second barrier layer between the first barrier layer and the gate dielectric layer, and the first gate structure includes no second barrier layer. In one or more of the foregoing and following embodiments, the second and third gate structure further includes a second work function adjustment layer made of a different material than the first work function adjustment layer, and the first gate structure includes no second work function adjustment layer. In one or more of the foregoing and following embodiments, a thickness of the second work function adjustment layer in the second gate structure is smaller than a thickness of the second work function adjustment layer in the third gate structure. In one or more of the foregoing and following embodiments, the first work function adjustment layer is made of one selected from the group consisting of TiAl, TiAlC, TaAl, TaAlC and TiAlN aluminum, and the second work function adjustment layer includes TiN.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a first field effect transistor (FET) including a first gate structure disposed over a first channel region;
 a second FET including a second gate structure disposed over a second channel region; and
 a third FET including a third gate structure disposed over a third channel region, wherein:
 a threshold voltage of the first FET is different from a threshold voltage of the second FET and a threshold voltage of the third FET,
 each of the first, second, and third gate structures includes:
  a gate dielectric layer;
  a first work function adjustment layer over the gate dielectric layer;
  a metal gate electrode layer disposed over the first work function adjustment layer; and
  a first metal nitride layer disposed between the gate dielectric layer and the first work function adjustment layer,
 wherein the second and third gate structures further include:
  a second work function adjustment layer made of a different material than the first work function adjustment layer disposed between the first work function adjustment layer and the first metal nitride layer; and
  a second metal nitride layer disposed between the second work function adjustment layer and the first metal nitride layer,
 wherein the first gate structure does not include the second metal nitride layer,
 a thickness of the first metal nitride layer in the first gate structure is smaller than a thickness of the first metal nitride layer in the second gate structure and the third gate structure, and a thickness of the second metal nitride layer in the second gate structure and the third gate structure is less than a thickness of the first metal nitride layer in the second gate structure and the third gate structure.

2. The semiconductor device of claim 1, wherein the first metal nitride layer is made of TiN or TiN doped with Si and the second metal nitride layer is made of TaN.

3. The semiconductor device of claim 1, wherein the first gate structure includes no second work function adjustment layer.

4. The semiconductor device of claim 1, wherein:
the first work function adjustment layer includes aluminum, and
the second work function adjustment layer includes TiN.

5. The semiconductor device of claim 1, wherein the metal gate electrode layer includes a glue layer and a body metal layer.

6. The semiconductor device of claim 1, wherein the first FET is a fin FET including a fin structure, a part of which is the first channel region, and the second FET is a fin FET including a fin structure, a part of which is the second channel region.

7. A semiconductor device, comprising:
a first field effect transistor (FET) including a first gate structure disposed over a first channel region;
a second FET including a second gate structure disposed over a second channel region; and
a third FET including a third gate structure disposed over a third channel region, wherein:
a threshold voltage of the first FET is smaller, in an absolute value, than a threshold voltage of the second FET, and the threshold voltage of the second FET is smaller, in an absolute value, than a threshold voltage of the third FET,
each of the first, second and third gate structures includes:
a gate dielectric layer;
a first work function adjustment layer over the gate dielectric layer;
a metal gate electrode layer disposed over the first work function adjustment layer,
wherein the second and third gate structures further include a first barrier layer below the first work function adjustment layer, and the first gate structure includes no first barrier layer,
the first, second and third gate structures further include a second barrier layer on the gate dielectric layer, and
a thickness of the second barrier layer in the first gate structure is smaller than a thickness of the second barrier layer in the second gate structure and the third gate structure.

8. The semiconductor device of claim 7, wherein the second barrier layer is made of TiN or TiN doped with Si and the first barrier layer is made of TaN.

9. The semiconductor device of claim 7, wherein the second and third gate structure further include a second work function adjustment layer made of a different material than the first work function adjustment layer, and the first gate structure includes no second work function adjustment layer.

10. The semiconductor device of claim 9, wherein a thickness of the second work function adjustment layer in the second gate structure is smaller than a thickness of the second work function adjustment layer in the third gate structure.

11. The semiconductor device of claim 9, wherein:
the first work function adjustment layer is made of one selected from the group consisting of TiAl, TiAlC, TaAl, TaAlC and TiAlN.

12. The semiconductor device of claim 11, wherein the second work function adjustment layer includes TiN.

13. The semiconductor device of claim 7, wherein the metal gate electrode layer includes a glue layer and a body metal layer.

14. The semiconductor device of claim 13, wherein the glue layer includes TiN and the body metal layer includes W.

15. A semiconductor device, comprising:
a first field effect transistor (FET) including a first gate structure disposed over a first channel region;
a second FET including a second gate structure disposed over a second channel region; and
a third FET including a third gate structure disposed over a third channel region, wherein:
a threshold voltage of the first FET is smaller, in an absolute value, than a threshold voltage of the second FET, and the threshold voltage of the second FET is smaller, in an absolute value, than a threshold voltage of the third FET,
each of the first, second and third gate structures includes:
a gate dielectric layer;
a first work function adjustment layer over the gate dielectric layer;
a metal gate electrode layer disposed over the first work function adjustment layer; and
a first barrier layer on the gate dielectric layer,
wherein the second and third gate structures further include a second work function adjustment layer made of a different material than the first work function adjustment layer disposed between the first work function adjustment layer and the first barrier layer,
the second and third gate structures include a second barrier layer disposed between the first barrier layer and the second work function adjustment layer, and
a thickness of the first barrier layer in the first gate structure is smaller than a thickness of the first barrier layer in the second gate structure and the third gate structure.

16. The semiconductor device of claim 15, wherein the first gate structure includes no second work function adjustment layer.

17. The semiconductor device of claim 15, wherein in the first gate structure, the first work function adjustment layer is in direct contact with the first barrier layer.

18. The semiconductor device of claim 15, wherein a thickness of the second work function adjustment layer in the second gate structure is smaller than a thickness of the second work function adjustment layer in the third gate structure.

19. The semiconductor device of claim 15, wherein the first work function adjustment layer is made of one selected from the group consisting of TiAl, TiAlC, TaAl, TaAlC and TiAlN.

20. The semiconductor device of claim 19, wherein the second work function adjustment layer includes one of MoN, WCN or WN.

* * * * *